United States Patent
Yu

(10) Patent No.: US 11,508,868 B2
(45) Date of Patent: Nov. 22, 2022

(54) AVALANCHE PHOTODIODE STRUCTURE

(71) Applicant: ROCKLEY PHOTONICS LIMITED, London (GB)

(72) Inventor: Guomin Yu, Glendora, CA (US)

(73) Assignee: Rockley Photonics Limited, Oxford (GB)

( * ) Notice: Subject to any disclaimer, the term of this patent is extended or adjusted under 35 U.S.C. 154(b) by 0 days.

(21) Appl. No.: 16/613,739

(22) PCT Filed: May 15, 2018

(86) PCT No.: PCT/EP2018/062519
§ 371 (c)(1),
(2) Date: Nov. 14, 2019

(87) PCT Pub. No.: WO2018/210810
PCT Pub. Date: Nov. 22, 2018

(65) Prior Publication Data
US 2021/0175384 A1 Jun. 10, 2021

(30) Foreign Application Priority Data
May 15, 2017 (GB) ..................... 1707754

(51) Int. Cl.
*H01L 31/10* (2006.01)
*H01L 31/107* (2006.01)
(Continued)

(52) U.S. Cl.
CPC ...... *H01L 31/1075* (2013.01); *H01L 29/6609* (2013.01); *H01L 31/028* (2013.01); *H01L 31/02327* (2013.01); *H01L 31/1804* (2013.01)

(58) Field of Classification Search
CPC ............. H01L 31/1075; H01L 29/6609; H01L 31/02327; H01L 31/028; H01L 31/1804
See application file for complete search history.

(56) References Cited

U.S. PATENT DOCUMENTS

| | | | |
|---|---|---|---|
| 7,082,248 B1 * | 7/2006 | Morse | G02B 6/12004 385/131 |
| 7,209,623 B2 | 4/2007 | Morse | |

(Continued)

FOREIGN PATENT DOCUMENTS

| | | |
|---|---|---|
| CN | 1858916 A | 11/2006 |
| CN | 104247046 A | 12/2014 |
| WO | WO 2017/023301 A1 | 2/2017 |

OTHER PUBLICATIONS

Huang, M. et al., "Recess-type waveguide integrated germanium on silicon avalanche photodiode", OFC, 2021, 3 pages, OSA.
(Continued)

*Primary Examiner* — S M Sohel Imtiaz
(74) *Attorney, Agent, or Firm* — Lewis Roca Rothgerber Christie LLP

(57) ABSTRACT

A germanium based avalanche photo-diode device and method of manufacture thereof. The device including: a silicon substrate; a lower doped silicon region, positioned above the substrate; a silicon multiplication region, positioned above the lower doped silicon region; an intermediate doped silicon region, positioned above the silicon multiplication region; an un-doped germanium absorption region, position above the intermediate doped silicon region; an upper doped germanium region, positioned above the un-doped germanium absorption region; and an input silicon waveguide; wherein: the un-doped germanium absorption region and the upper doped germanium region form a germanium waveguide which is coupled to the input waveguide, and the device also includes a first electrode and a second electrode, and the first electrode extends laterally to contact the lower doped silicon region and the second electrode extends laterally to contact the upper doped germanium region.

20 Claims, 30 Drawing Sheets

(51) Int. Cl.
  *H01L 31/0232* (2014.01)
  *H01L 31/028* (2006.01)
  *H01L 31/18* (2006.01)
  *H01L 29/66* (2006.01)

(56) References Cited

U.S. PATENT DOCUMENTS

| | | | |
|---|---|---|---|
| 9,219,184 | B2 | 12/2015 | Huang et al. |
| 9,287,432 | B2 | 3/2016 | Shi et al. |
| 9,299,864 | B2 | 3/2016 | Shi et al. |
| 9,780,248 | B2 | 10/2017 | Huang et al. |
| 2012/0001284 | A1* | 1/2012 | Tut ................ H01L 31/105 257/432 |
| 2013/0071058 | A1* | 3/2013 | Lim ................. G02F 1/025 385/2 |
| 2014/0151839 | A1 | 6/2014 | Kang et al. |
| 2014/0231946 | A1* | 8/2014 | Kang ............... H01L 31/107 257/432 |
| 2015/0001581 | A1* | 1/2015 | Oda ............... H01L 31/1075 257/186 |
| 2015/0097256 | A1 | 4/2015 | Ang et al. |
| 2015/0293384 | A1* | 10/2015 | Ogawa ............ G02B 6/1228 385/2 |
| 2015/0340538 | A1* | 11/2015 | Novack ......... H01L 31/035281 250/214 A |
| 2016/0126381 | A1* | 5/2016 | Wang .............. G02B 6/122 257/429 |
| 2016/0204298 | A1* | 7/2016 | Chen .............. H01L 31/02327 257/432 |
| 2016/0351743 | A1* | 12/2016 | Yu ................. G02B 6/12004 |
| 2018/0219120 | A1* | 8/2018 | Huang ........... H01L 31/02327 |

OTHER PUBLICATIONS

Huang, Z. et al., "Low-voltage Si—Ge avalanche photodiode", Apr. 6, 2015, 3 pages, Hewlett-Packard Development Company, L.P.

International Search Report and Written Opinion of the International Searching Authority, dated Jul. 17, 2018, Corresponding to PCT/EP2018/062519, 14 pages.

Kang, Yimin et al., "Monolithic germanium/silicon avalanche photodiodes with 340 GHz gain-bandwidth product", Nature Photonics, Dec. 7, 2008, pp. 59-63, vol. 3, Macmillan Publishers Limited.

U.K. Intellectual Property Office Search and Examination Report, dated Oct. 30, 2017, for Patent Application No. GB 1707754.6, 8 pages.

Vivien, Laurent et al., "Handbook of Silicon Photonics", 2013, 6 pages, Taylor and Francis.

Partial English translation of the Chinese Notification of the First Office Action, for Patent Application No. 201880004525.9, dated Aug. 12, 2022, 14 pages.

* cited by examiner

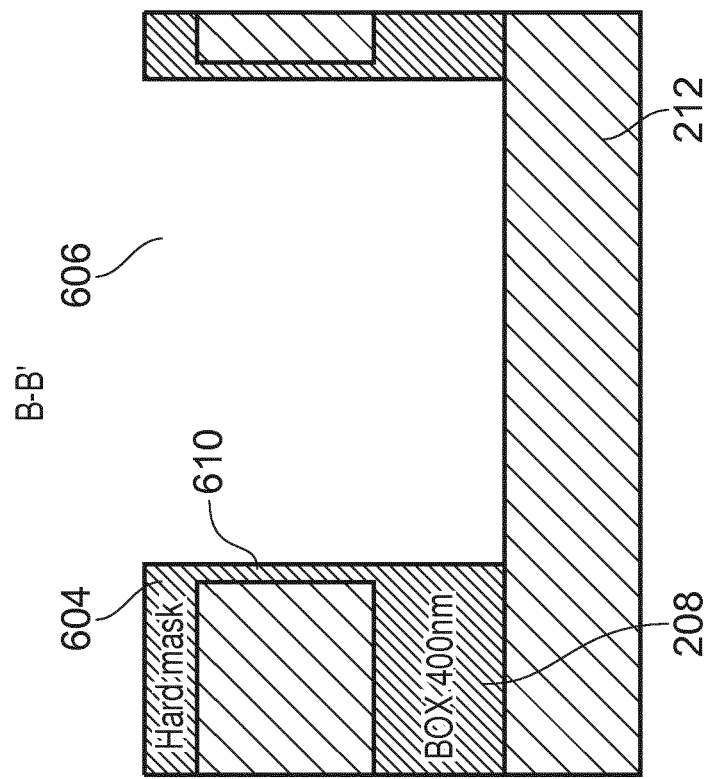
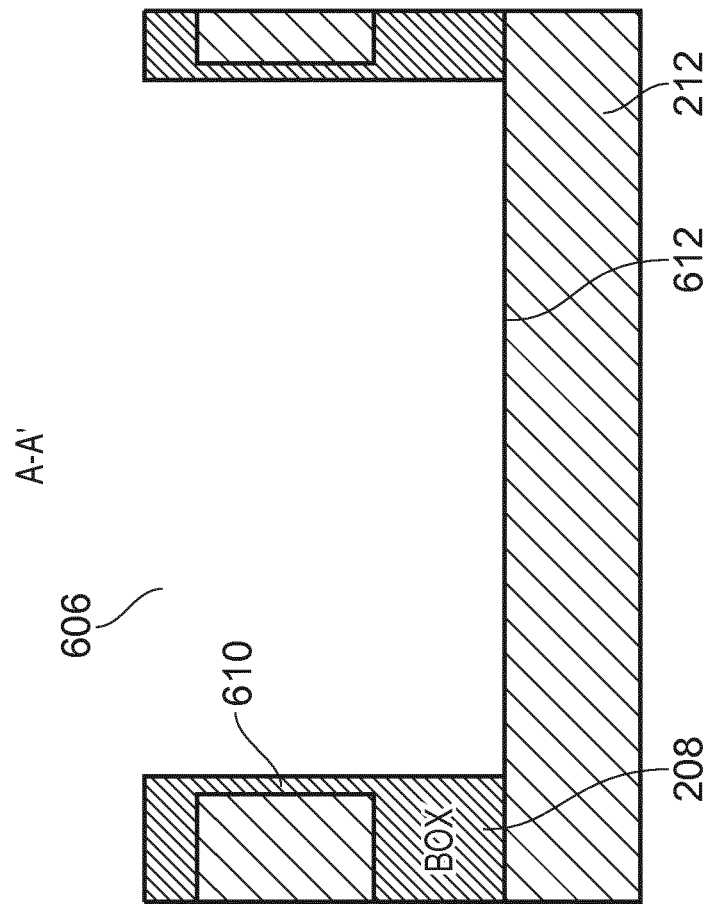

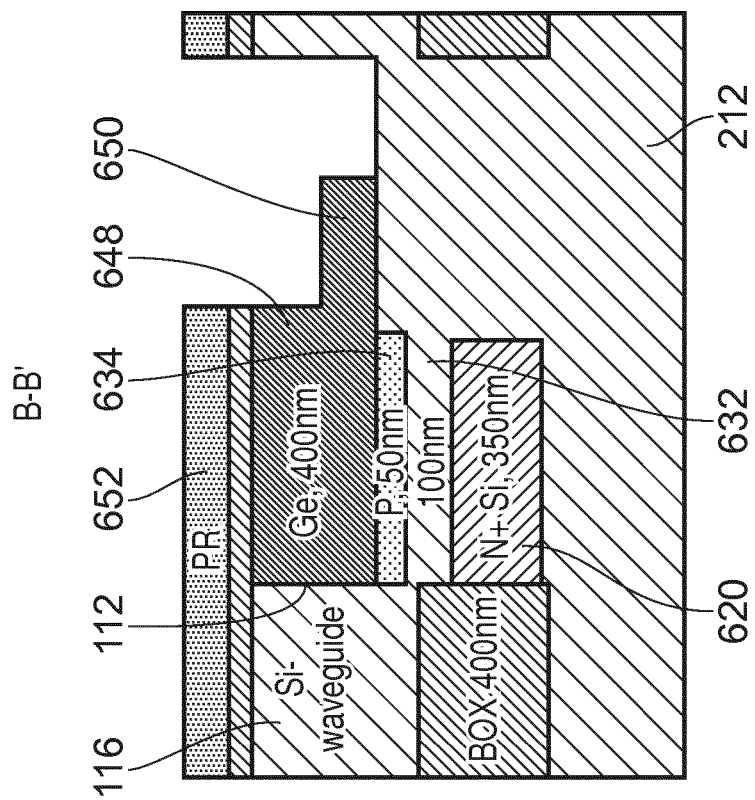
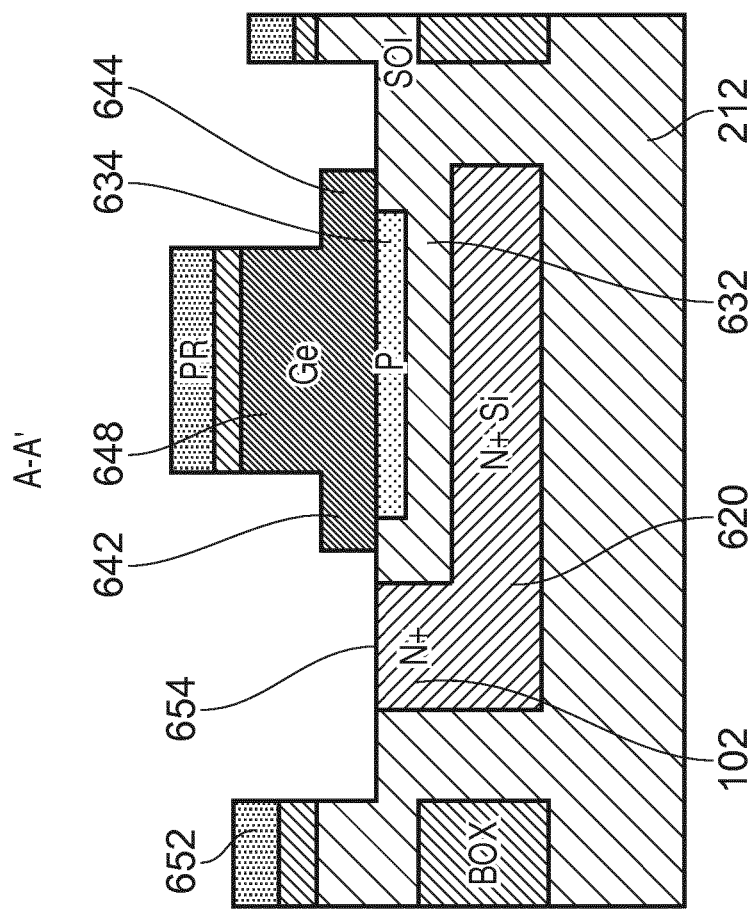

FIG. 6R(ii)

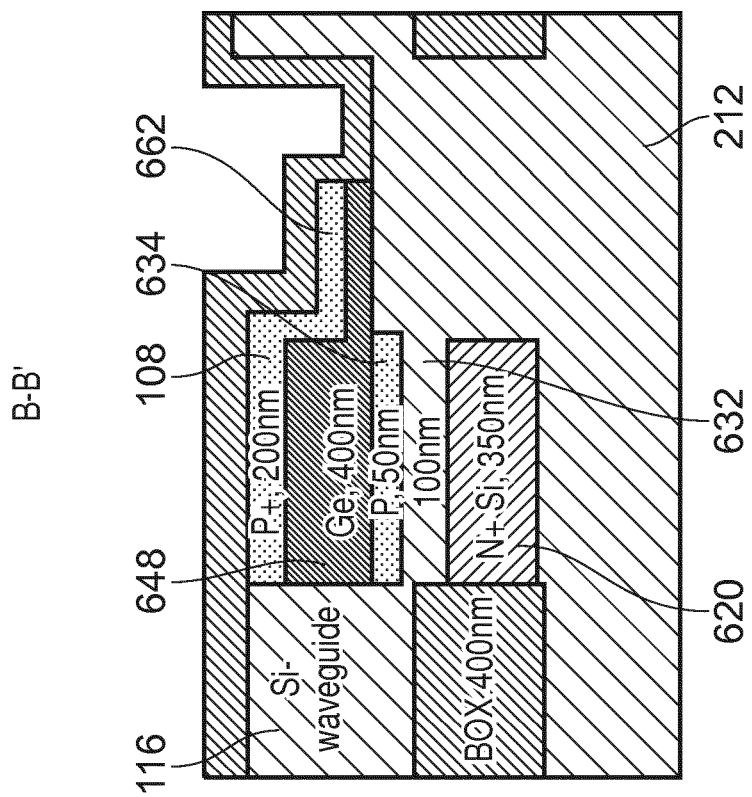
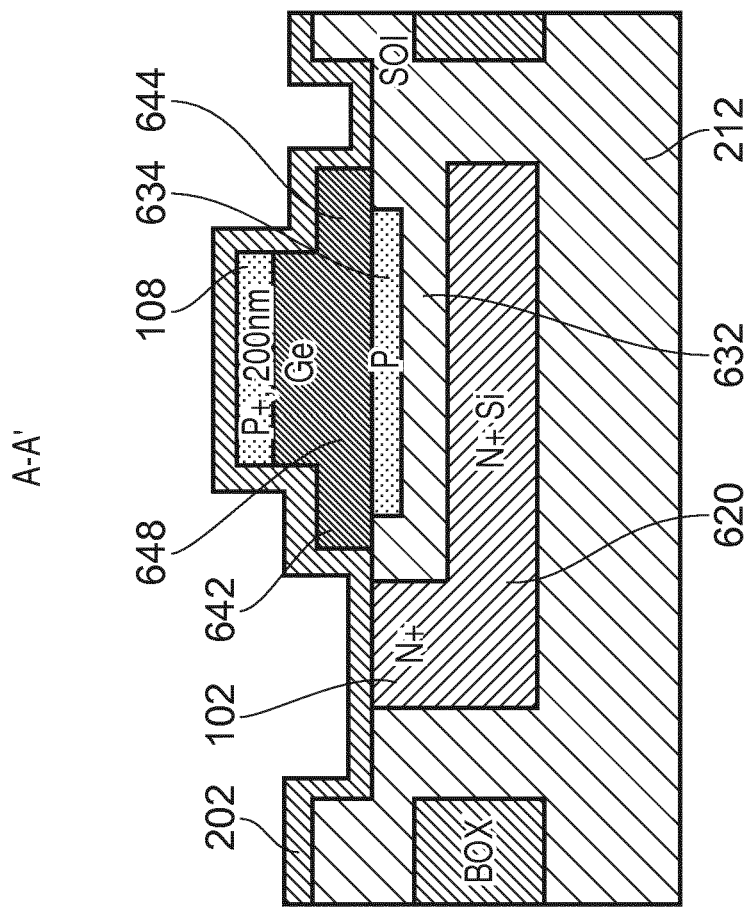

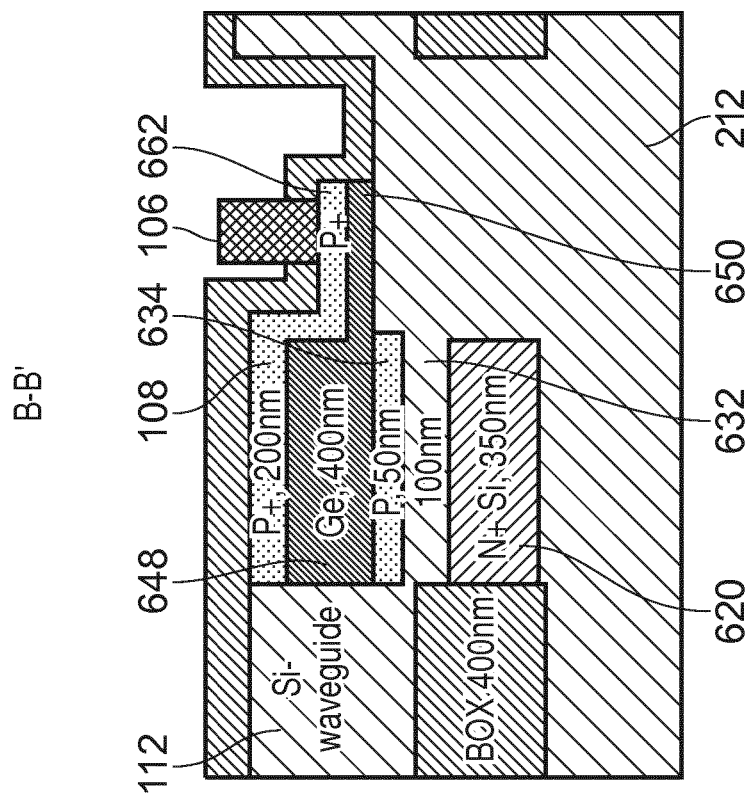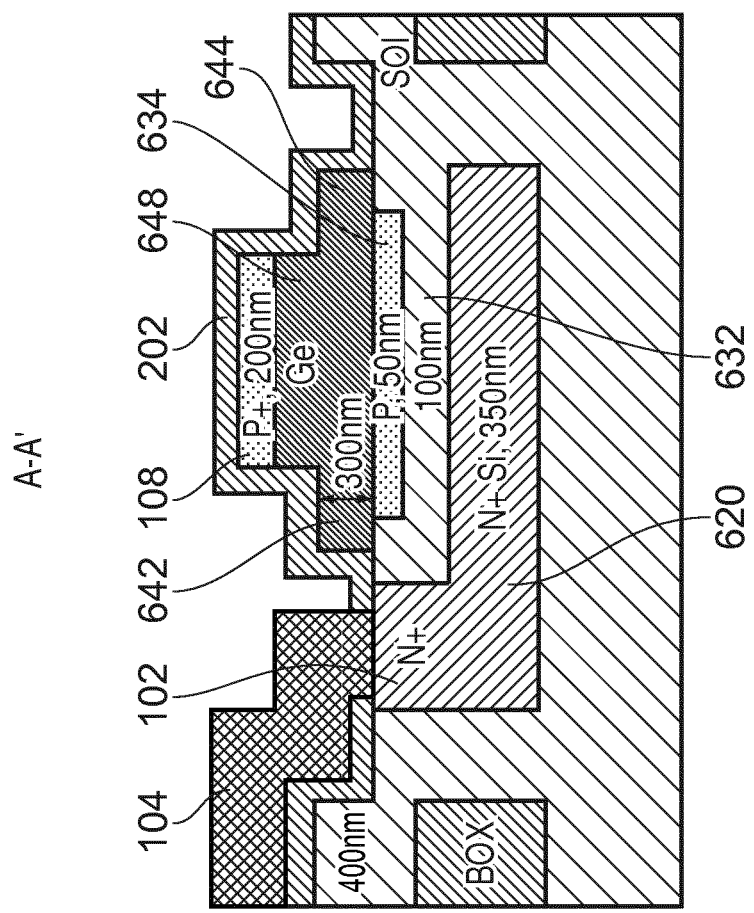

AVALANCHE PHOTODIODE STRUCTURE

CROSS-REFERENCE TO RELATED APPLICATION(S)

This application is a national stage entry, under 35 U.S.C. § 371, of International Application Number PCT/EP2018/062519, filed on May 15, 2018, which claims priority to British Patent Application Number 1707754.6, filed May 15, 2017. The entire contents of all of the applications identified in this paragraph are incorporated herein by reference.

FIELD OF THE INVENTION

The present invention relates to avalanche photodiodes, and particularly avalanche photodiodes based on germanium.

BACKGROUND

Optical communication links seem apt for replacing the traditional electronic transmission lines in high speed interconnects, such as those used in data centres. One major challenge however in the widespread uptake of optical communication links is the improvement of the total power efficiency of the link. One device which may prove useful in improving the power efficiency of a link is the avalanche photodiode (APD).

The avalanche photodiode is a sensitive semi-conductive electronic device, which exploits the photo-electronic effect to convert light into electricity. Generally, avalanche photodiodes can be thought of as providing gain through avalanche multiplication. Avalanche breakdown is a phenomena in which, through the application of an electric field, charge carriers cause the production of other charge carriers within a multiplication region of a device.

However, the deployment of avalanche photodiodes in optical communication systems requires high bias voltages. For example, conventional avalanche photodiodes require a bias voltage of >25V. It is desirable to have a lower bias voltage for optical communication systems so as to reduce power consumption. Furthermore, the fabrication of an avalanche photodiode on a scale useable for optical electronics (i.e. within an optical circuit) may be problematic and fraught with difficulties.

SUMMARY

Accordingly, in a first aspect, the invention provides: a germanium based avalanche photo-diode device, the device including:
  a silicon substrate;
  a lower doped silicon region, positioned above the silicon substrate;
  a silicon multiplication region, positioned above the lower doped silicon region;
  an intermediate doped silicon region, positioned above the silicon multiplication region;
  an un-doped germanium absorption region, positioned above the intermediate doped silicon region;
  an upper doped germanium region, positioned above the un-doped germanium absorption region; and
  an input silicon waveguide;
  wherein: the un-doped germanium absorption region and the upper doped germanium region form a germanium waveguide which is coupled to the input silicon waveguide, and the device also includes a first electrode and a second electrode, and the first electrode extends laterally to contact the lower doped silicon region and the second electrode extends laterally to contact the upper doped germanium region.

By lateral, it may be meant a direction which extends parallel to the surface of the substrate. By waveguide, it may be meant a region of the device which confines an optical mode of light contained therein. The germanium waveguide may be referred to as a germanium guiding region. The germanium waveguide may be a rib waveguide, comprising a rib and slab, which may both be butt coupled to the input silicon waveguide.

Advantageously, by providing lower and upper doped regions, with a multiplication and intermediate doped region disposed therebetween, the operating voltage may be reduced in comparison to the prior art. Moreover, provision of first and second electrodes which extend laterally to contact their respective doped regions may result in a device which is easier to manufacture.

In a second aspect, the invention provides a method of fabricating a germanium based avalanche photodiode device, comprising:
  providing a silicon substrate and an insulator layer, above which is a silicon-on-insulator layer;
  etching the silicon-on-insulator layer and the insulator layer, to form a cavity of the silicon-on-insulator layer which extends to the substrate;
  epitaxially growing a silicon layer from a bed of the cavity;
  doping the grown silicon layer to form a lower doped region;
  growing a further silicon layer from an upper surface of the lower doped region;
  doping a first part of the further silicon layer to form an intermediate doped region;
  epitaxially growing a germanium layer from an upper surface of the further silicon layer to form a waveguide;
  doping a part of the germanium layer to form an upper doped region;
  providing a first electrode and a second electrode, the first electrode contacting the lower doped silicon region and the second electrode contacting the upper doped germanium region.

By epitaxially growing, it may be meant that the silicon layer and/or germanium layer may be grown via selective area epitaxy.

Optional features of the invention will now be set out. These are applicable singly or in any combination with any aspect of the invention.

The lower doped silicon region may include a part which extends away from the substrate so as to contact the first electrode. The lower doped silicon region may be horizontally aligned with a buried oxide layer of the device. The lower doped silicon region may be directly adjacent to the substrate.

The upper doped germanium region may include a part which extends towards the substrate so as to contact the second electrode. This part may extend from a portion of the upper doped germanium region which is distal to the substrate to a portion of the upper doped germanium region which is proximal to the substrate. This part may also extend parallel to the substrate. The second electrode may contact the upper doped germanium region at a part of the upper doped germanium region which is distal to the input silicon waveguide. The second electrode may contact the upper doped germanium region at a part of the upper doped germanium region which is not an uppermost surface thereof. The second electrode may contact the upper doped germanium region at a slab portion of the germanium waveguide.

The upper doped germanium region may be immediately adjacent to the waveguide.

The germanium waveguide and the silicon waveguide may be rib waveguides. The germanium waveguide may be disposed immediately adjacent to the intermediate doped region, on an opposing side of the intermediate doped silicon region to the lower doped silicon region. The multiplication region may include the silicon region between the intermediate doped silicon region and the lower doped silicon region.

The germanium waveguide may have a first lateral edge, and the lower doped silicon region may be coterminous in lateral extension with the first lateral edge of the germanium waveguide.

The germanium waveguide may have a first lateral edge, and the lower doped silicon region may extend laterally beyond the first lateral edge of the germanium waveguide.

The multiplication silicon region, germanium waveguide, and intermediate doped silicon region may be within a cavity of a silicon-on-insulator layer.

The multiplication silicon region may be between 50 nm and 150 nm thick. In other examples, the multiplication silicon region may be between 75 nm and 125 nm thick. In yet further examples, the multiplication silicon region is 100 nm thick. Where 'thickness' of a region or layer is referred to, it may be that the term refers to the absolute height of the device (i.e. to what extent it extends vertically). Advantageously, a multiplication silicon region with such dimensions has a lower operating voltage than prior art examples (for example, the operating voltage may be on the order of 10V).

The upper doped germanium region and the lower doped silicon region may be heavily doped as compared to the intermediate doped region. For example, the concentration of dopants in the upper and lower region may be a factor of 10 or more greater than the concentration of dopants in the intermediate doped region.

The intermediate doped region may be doped with dopants of a same species as the upper doped region.

The fabrication method may include a step of: after etching the device and before epitaxially growing the silicon layer: disposing an insulating layer along sidewalls and the bed of the cavity. The fabrication method may further include the step of: etching the insulating layer which along the bed of the cavity, thereby leaving an insulating layer along the sidewalls of the cavity.

The fabrication method may include a step of: doping a region of the silicon layer grown from the bed of the cavity.

The fabrication method may include a step of in-situ doping the silicon layer grown from the bed of the cavity during the step of epitaxially growing the silicon layer from a bed of the cavity.

The fabrication method may include the step of: before doping the grown silicon layer: disposing a first photoresist over a part of the grown silicon layer; and, after doping the grown silicon layer: removing the first photoresist.

The fabrication method may include the step of: before doping the further silicon layer: disposing a second photoresist over a part of the further silicon layer; and, after doping the further silicon layer: removing the second photoresist.

The fabrication method may include a step of: etching a part of the waveguide, to thereby provide a rib waveguide having one or more slab regions.

The fabrication method may include a step of: before doping the part of the germanium layer: disposing a photoresist over a part of an upper most surface of the device; and after doping the part of the germanium layer: removing the photoresist.

The fabrication method may include a step of annealing the device.

The fabrication method may include a step of disposing a cladding layer over the device.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Figure 1:
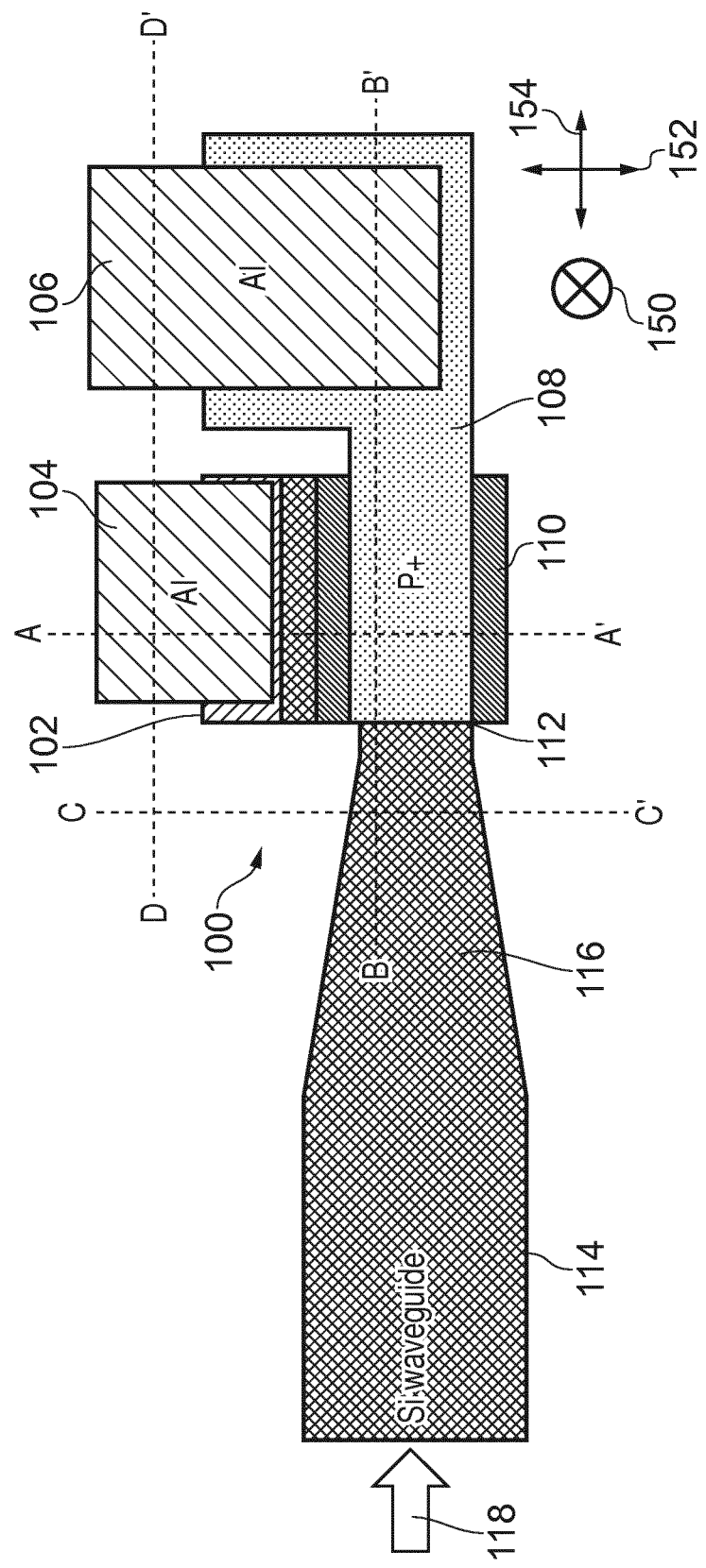
FIG. 1 shows top-down plan view of an avalanche photodiode.

FIG. 1, shows an avalanche photodiode 100. The device broadly composes: a P+ doped region 108, an N+ doped region 102, and a waveguide 110 disposed therebetween. Each of the doped regions is connected to respective electrodes 104 and 106 which extend in a lateral direction 152 across the device. Light may enter the device from direction 118, and pass through a silicon waveguide 114 into a tapered silicon waveguide region 116. The light continues through interface 112 into the germanium waveguide 110, whereupon it is absorbed to generate electron-hole pairs, of which the holes go to the P+ doped region 108 and the electrons go to the N+ doped region 102 when the device is reverse biased between the N+ region 102 and P+ region 108.

The device in FIG. 1 is presented in a top-down plan view. Therefore direction 150 represents moving into the device from above, whereas directions 152 and 154 are within the plane of the substrate of the device i.e. they are parallel thereto.

In use, a reverse bias voltage can be applied to electrodes 104 and 106. This produces an electric field passing from N+ doped region 102, through the intermediate waveguide 110, and into P+ doped region 108. Thus, as light passes through interface 112, it enters germanium waveguide where it is absorbed to generate electron-hole pairs, which are separated by the electric field in the waveguide. The holes go to the P+ doped region 108 and the electrons go to the N+ doped region 102 after accelerated by the high electrical field in the multiplication region (not shown in FIG. 1) to produce avalanche breakdown.

Figure 2A:
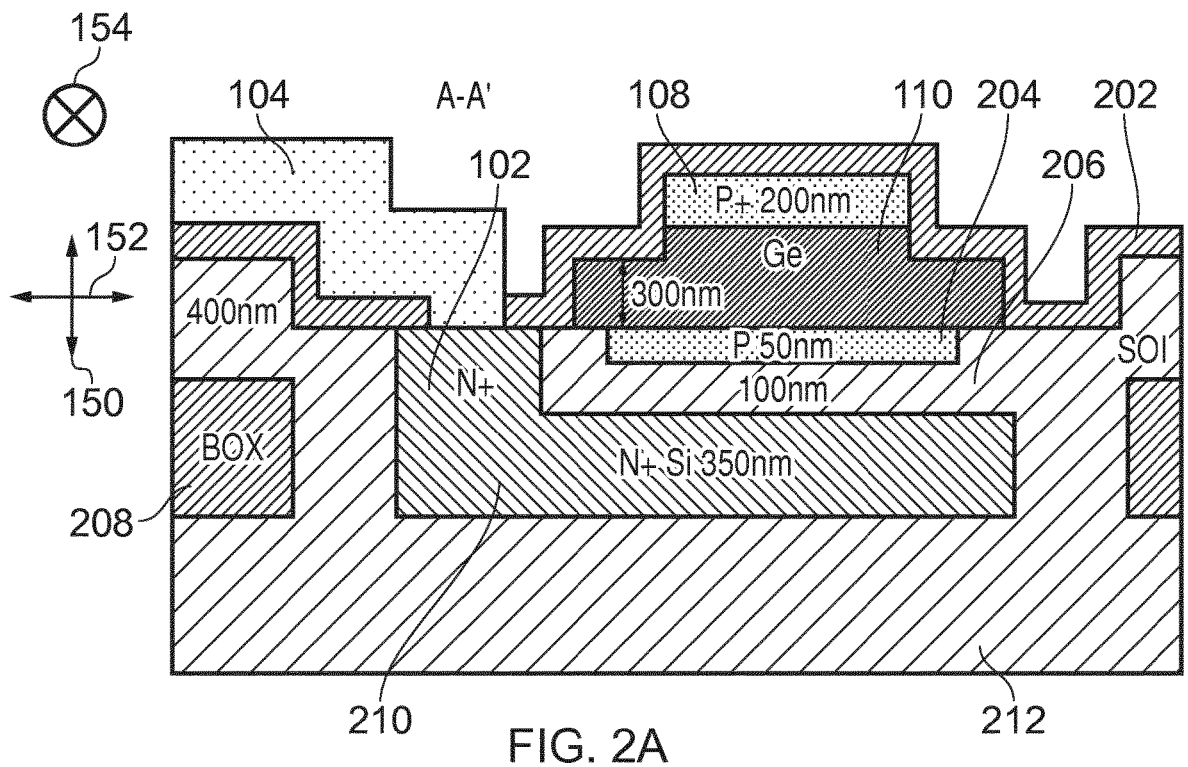
FIGS. 2A-2D show respective cross-sections of the device shown in FIG. 1.
Figure 2B:
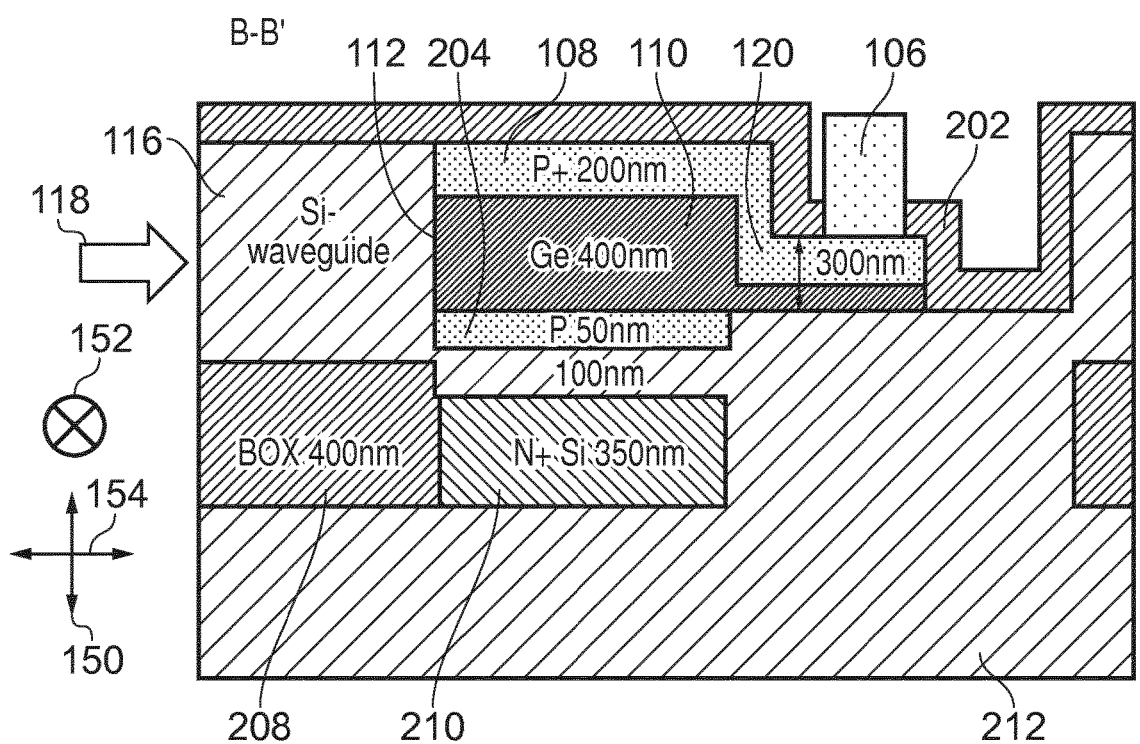

FIG. 2A shows the device 100 as taken along the cross-section A-A' indicated in FIG. 1, and FIG. 2B shows the same device as taken along the cross-section B-B' indicated in FIG. 1. As can be seen, the device comprises a substrate 212, upon which is an N+ doped region 210 and a buried oxide layer 208. The N+ doped region in this example is 350 nm in thickness. In other examples the N+ doped region is at least 200 nm in thickness (as measured from the top of the substrate to an uppermost surface of the N+ doped region). The doping concentration may be greater than $1 \times 10^{19}$ cm$^{-3}$. A part 102 of the N+ doped region extends away from the substrate in direction 150, to contact electrode 104, giving the N+ doped region an '1' shape.

Immediately above the N+ doped region 210 is an undoped (or intrinsic) multiplication region 206. In this example the multiplication region is 100 nm in thickness (as measured from the top of the N+ doped region to an uppermost surface of the multiplication region). The multiplication region may be formed of silicon, and should have a doping of no more than $1 \times 10^{16}$ cm$^{-3}$. Immediately above multiplication region 206 is a P doped region 204. This P doped region may be referred to as a charge layer, as it may be used to keep the electric field across the absorption germanium of the avalanche photodiode low, such that only the multiplication region 206 experiences large electric field (i.e. such that it might allow avalanche multiplication). The P doped region in this example is 50 nm in thickness (as measured from the top of the multiplication layer to an uppermost surface of the P doped region). In this example, the doping concentration in the P doped layer is around $2 \times 10^{18}$ cm$^{-3}$.

Immediately above the P doped region 204 is a germanium waveguide 110. The germanium waveguide in this example is a rib waveguide, having one or more slabs. The slabs in this example are approximately 300 nm in thickness (including the P+ doped region 120), and the rib may be 300 nm in thickness (as measured from the top of the P+108 doped region to the uppermost surface of the P+ doped slab region 120). As with the multiplication region, the germanium waveguide is not intentionally doped and therefore the doping concentration should be less than $1 \times 10^{16}$ cm$^{-3}$. The region of the germanium waveguide adjacent to the silicon waveguide 116 may have a height of 400 nm as measured from the top of the P doped region 204.

As is shown in FIG. 2B, the germanium waveguide is immediately adjacent to the tapered region 116 of the silicon waveguide 114. An interface 112 exists between the germanium waveguide and the tapered region 116. The tapered region 116 may have a width of around 1.5 µm.

Immediately above the rib of the germanium waveguide 110 is a P+ doped region 108, which is connected to the P+ doped region of the slab 120 via a portion of the P+ doped region 108 which extends towards the substrate. The P+ doped region in this example is 200 nm in thickness (as measured from the top of the rib to an uppermost surface of the P+ doped region). The doping in this example is at least $1 \times 10^{19}$ cm$^{-3}$. A part 120 of P+ doped region extends in a lateral direction 154 away from the germanium waveguide, to allow the second electrode 106 to electrically contact it.

The device is generally covered by a SiO2 cladding layer 202. However, via openings are fabricated in the cladding layer for the first electrode 104 and second electrode 106. This allows the electrodes to contact respective parts of the N+ and P+ doped regions 102 and 120.

Figure 2C:
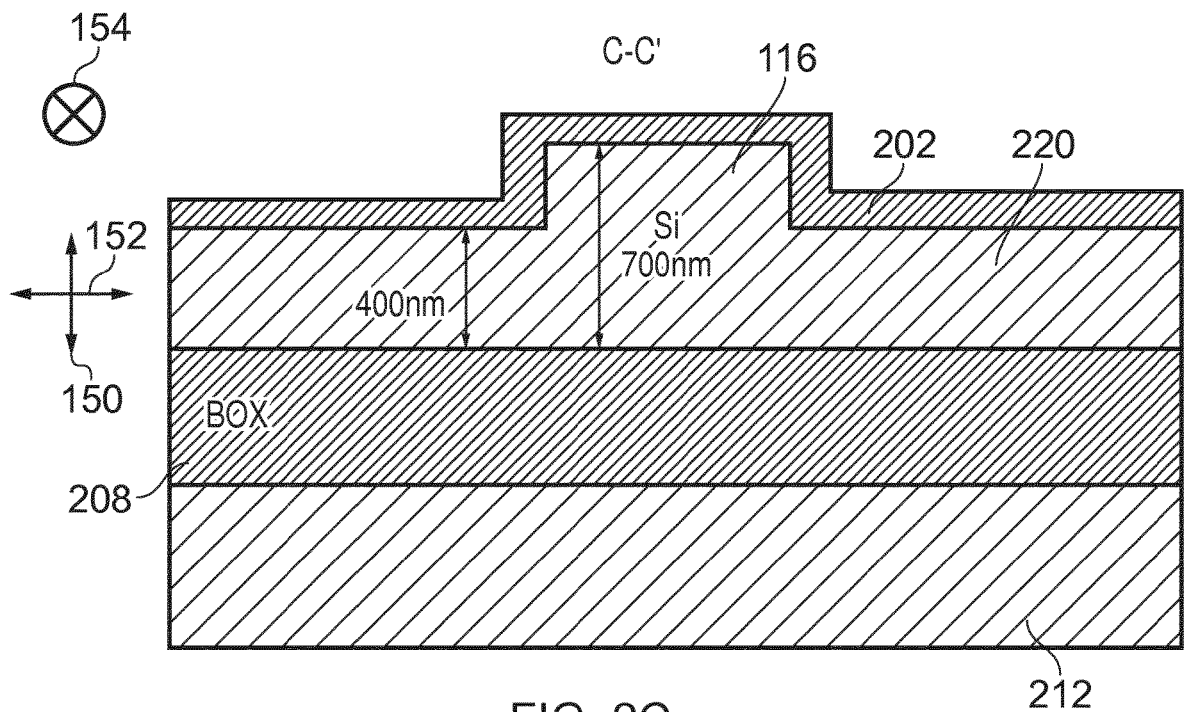
Figure 2D:
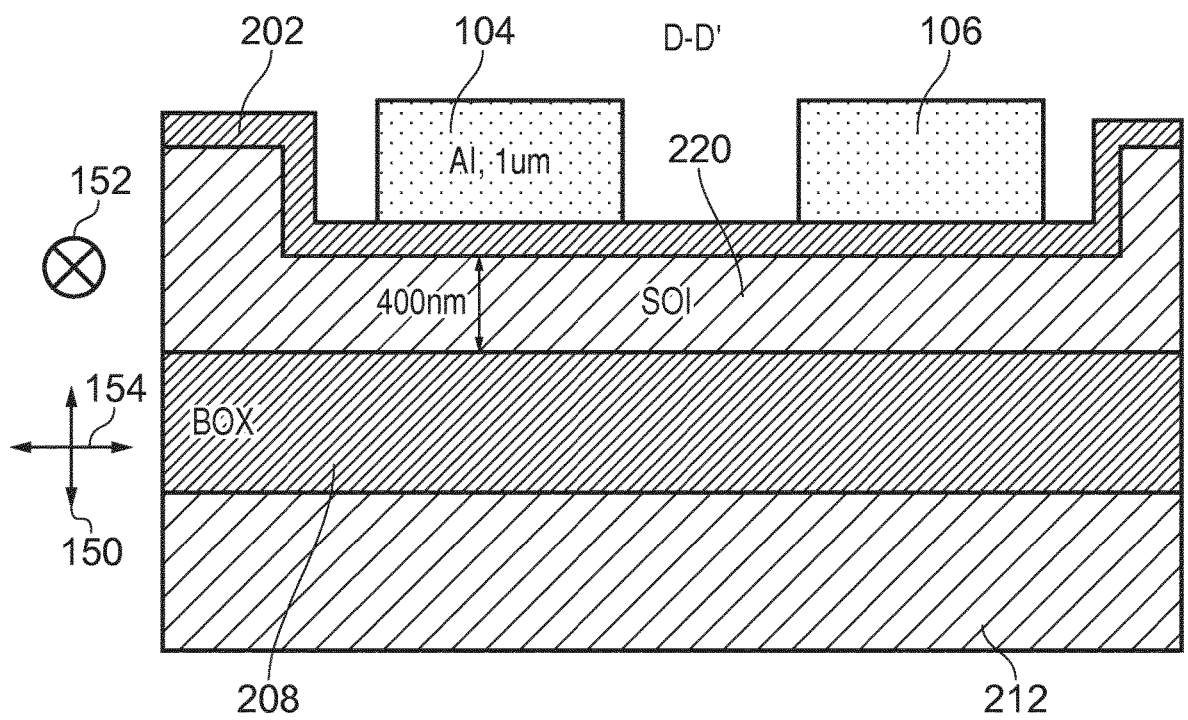

FIGS. 2C and 2D show the device 100 along respective cross-sections C-C' and D-D'. As can be seen in FIG. 2C, the silicon waveguide 116 may be a rib waveguide, where the waveguide is approximately 700 nm tall (as measured from the top of the buried oxide layer 208 to an uppermost surface of the silicon rib). A slab 220 of the waveguide may be 400 nm tall (as measured from the top of the buried oxide layer 208 to an uppermost surface of the slab). The cladding layer 202 is disposed over the top of the silicon waveguide. As can be seen in FIG. 2D, the slab 220 extends along direction 154 and is formed by etching the silicon-on-insulator layer to make the silicon rib waveguide. The cladding layer 202 is disposed over this silicon-on-insulator layer, and the first and second electrodes 104 and 106 are disposed on this cladding layer.

Figure 3A:
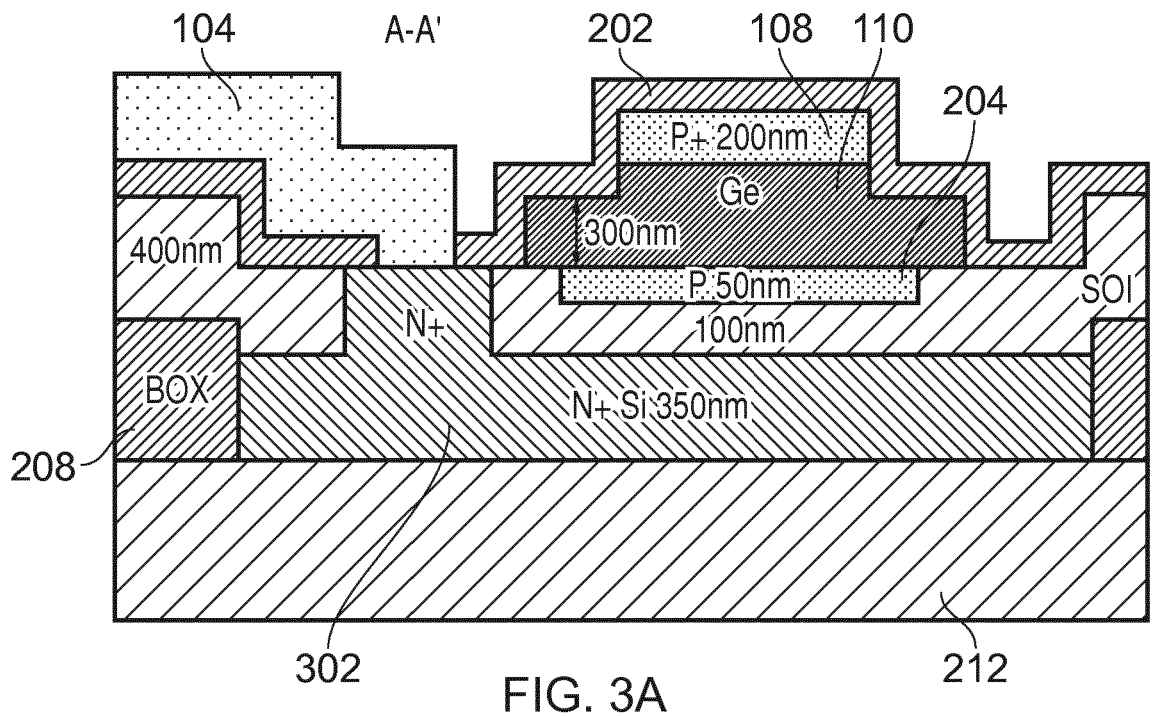
FIGS. 3A and 3B show respective cross-sections of a variant device.
Figure 3B:
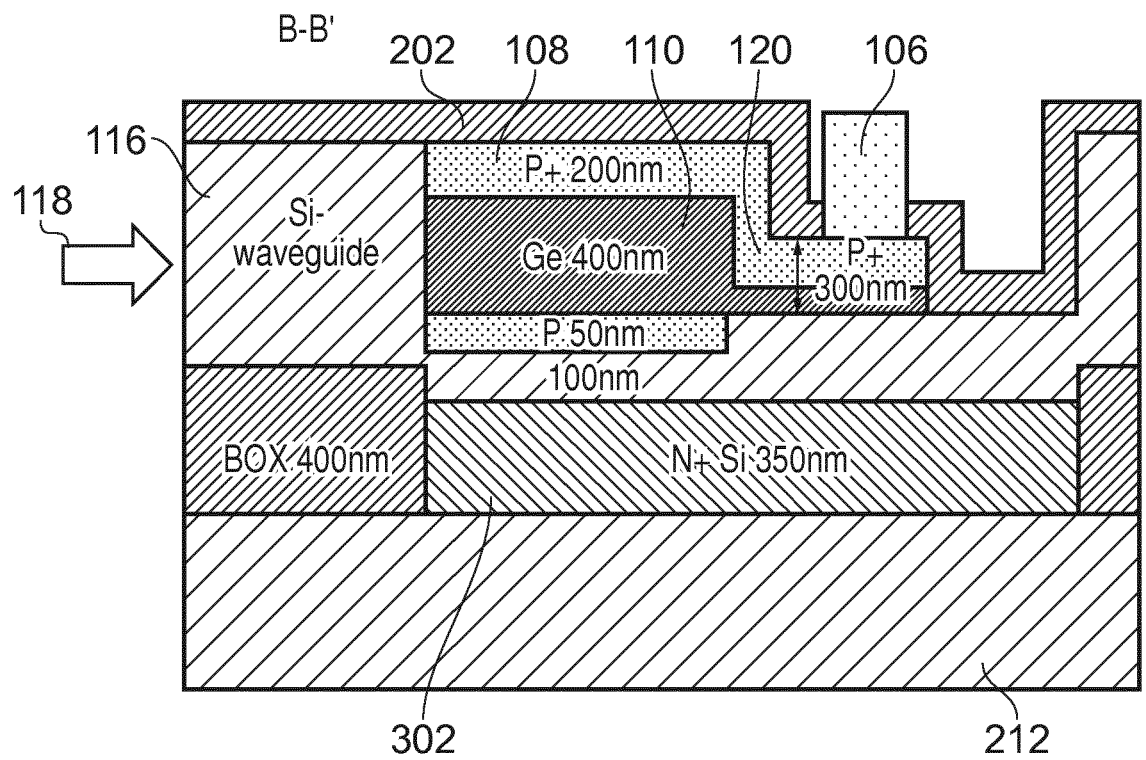

FIGS. 3A and 3B shows a variant device, where like features are indicated by like reference numerals. Where the device shown in FIGS. 3A and 3B differs from that shown in FIGS. 2A and 2B, is in the lateral extension of the N+ doped region 302. In FIGS. 2A and 2B, the N+ doped region 210 was coterminous in lateral extension along direction 154 with one side of the germanium waveguide 110, which is made by ion implantation. Whereas, in FIGS. 3A and 3B, the N+ doped region 302 laterally extends further in direction 154 than the germanium waveguide 110, which is made by in situ doping during the regrowth of region 302.

Figure 4A:
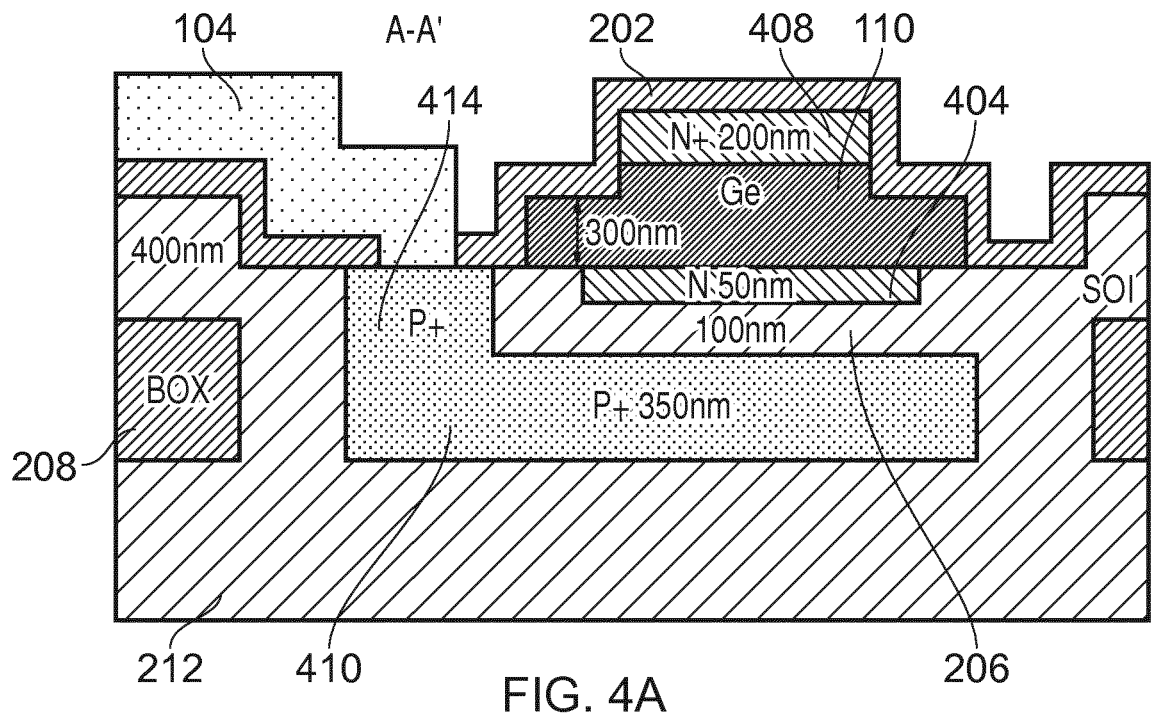
FIGS. 4A and 4B show respective cross-sections of a variant device.
Figure 4B:
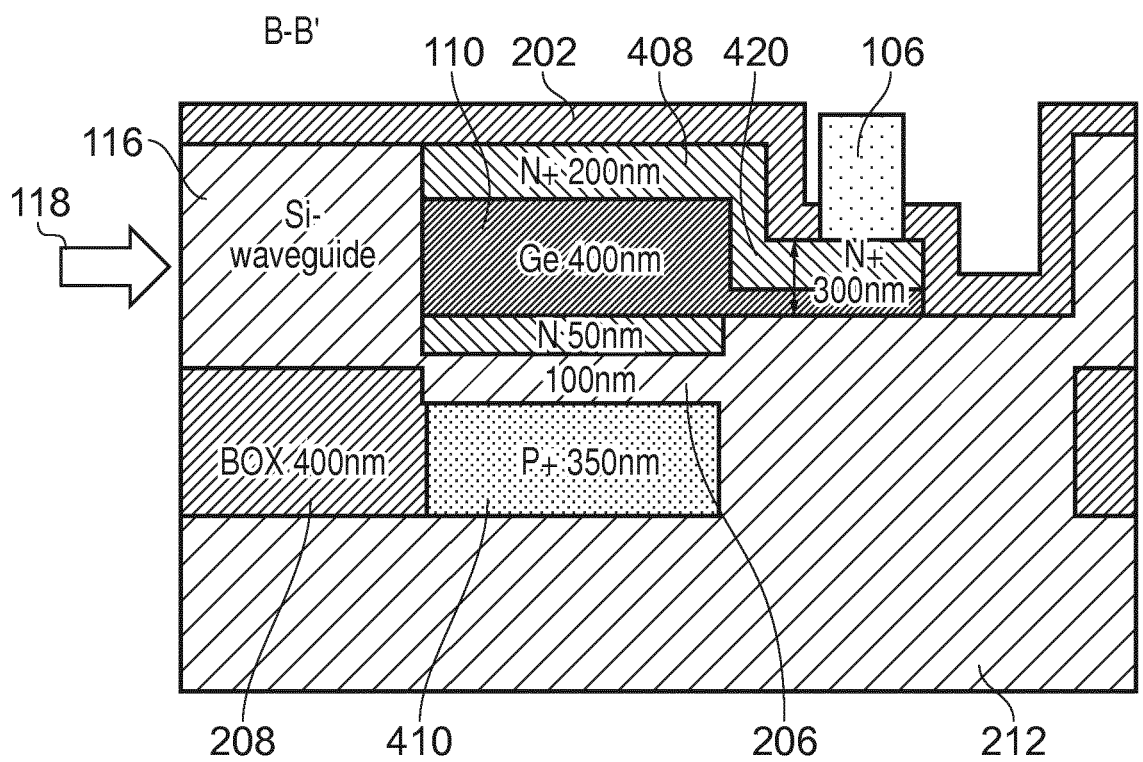
Figure 5A:
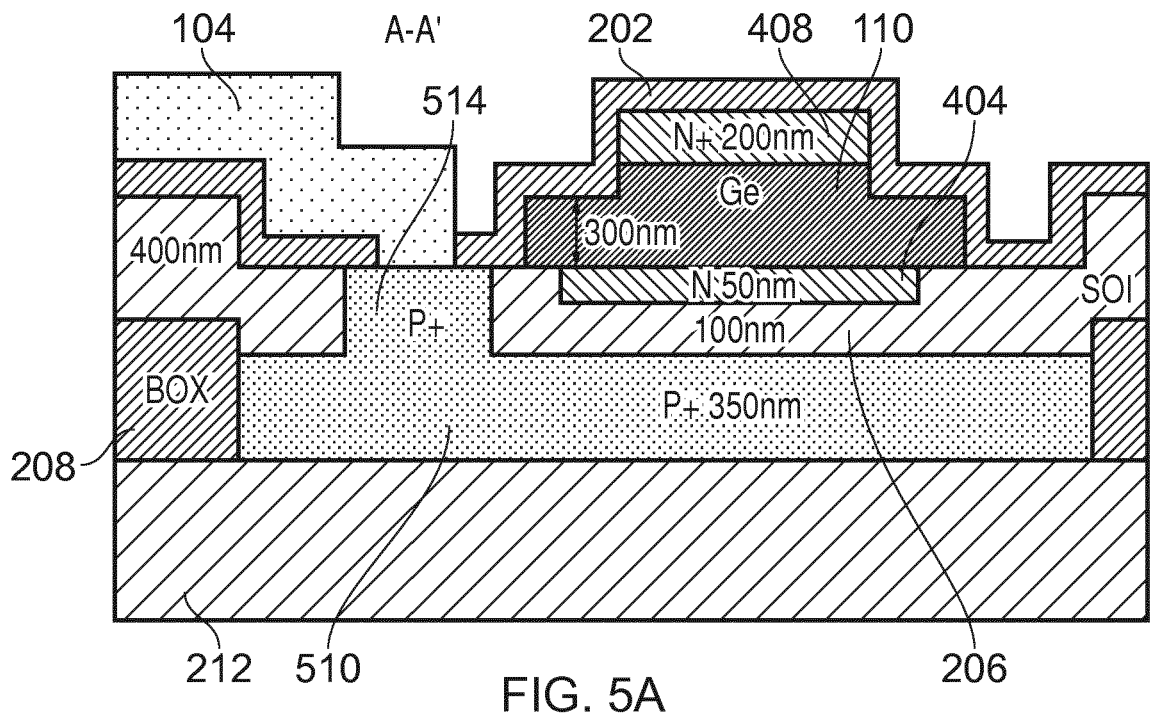
FIGS. 5A and 5B show respective cross-sections of a variant device.
Figure 5B:
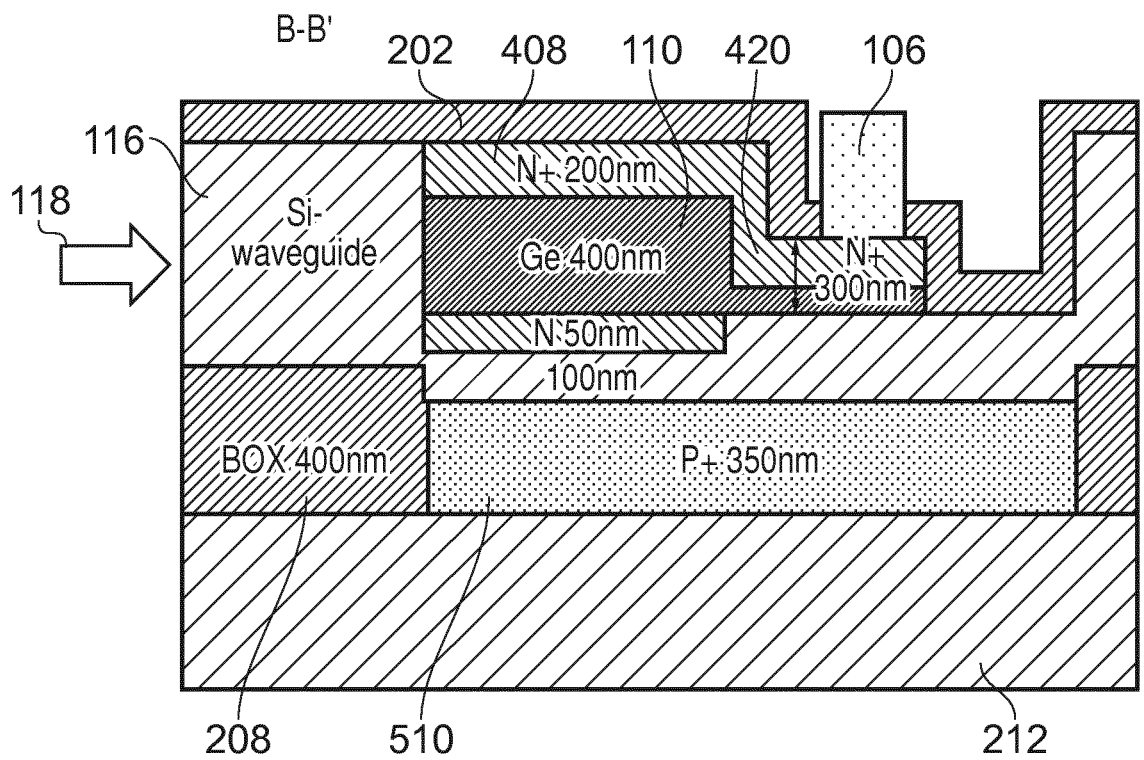

FIGS. 4A and 4B show a further variant device, where like features are indicated by like reference numerals. In contrast to the device in FIGS. 2A and 2B, the uppermost doped region 408 is an N+ doped region, the lowermost doped region 410 is a P+ doped region, and the intermediate doped region 404 is an N doped region. Similarly, FIGS. 5A and 5B show a further variant device, where the doped regions in FIGS. 3A and 3B have been switched. Therefore the laterally extending doped region 510 is P+ doped, the intermediate doped region 404 is N doped, and the uppermost doped region 408 is N+ doped.

Figure 6A:
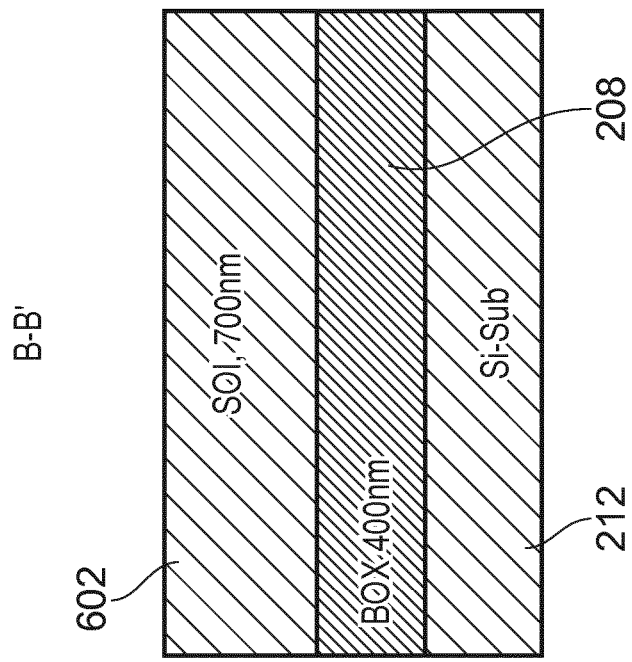
FIG. 6A(i)-6T(ii) show various stages in the manufacture of the device shown in FIG. 1.
Figure 6A:
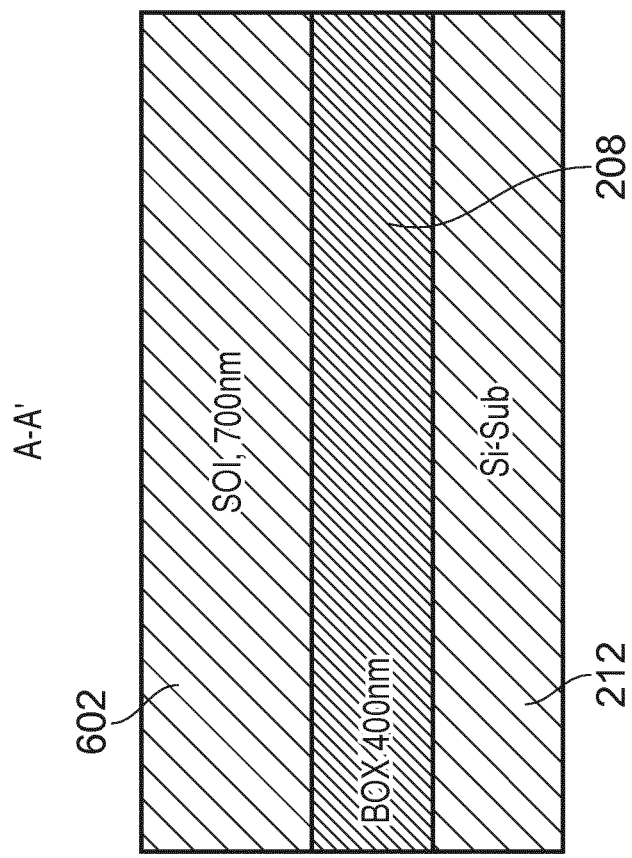
Figure 7:
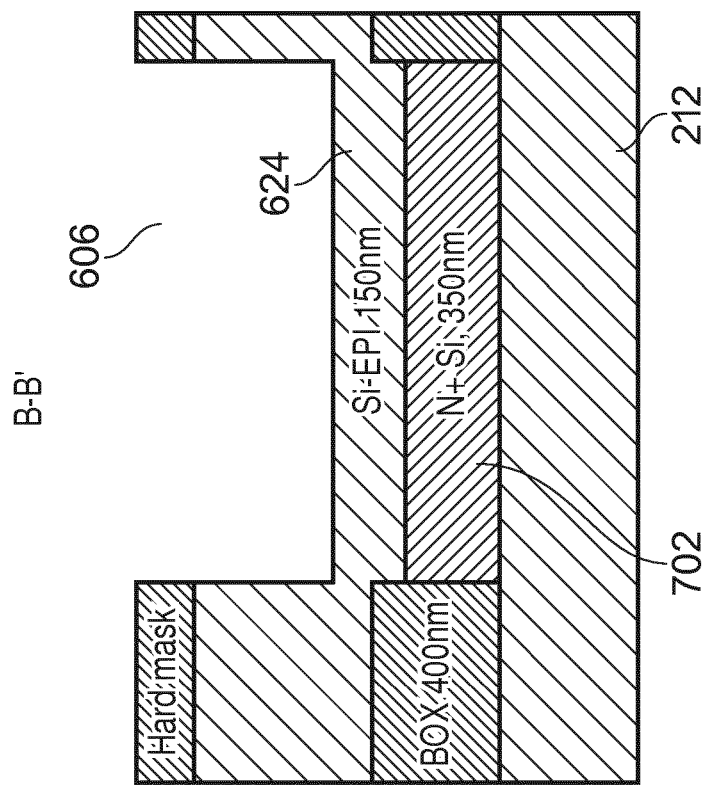
FIGS. 7(i) and 7(ii) show a variant manufacturing step.
Figure 7I:
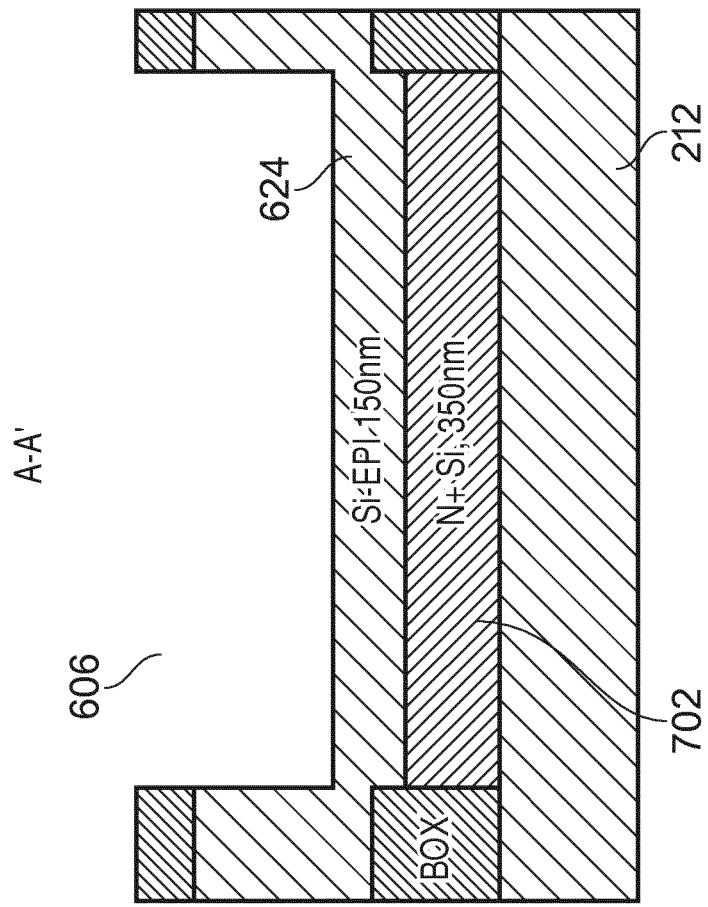

A method of manufacturing the above devices is now discussed in relation to FIGS. 6A(i)-6T(ii) (and a variant in one of the steps of manufacture is shown in FIGS. 7(i) and 7(ii)). In each set of figures, the (i) figure shows the manufacturing step along the A-A' cross section and the (ii) figure shows the same manufacturing step along the B-B' cross section.

Therefore, starting from FIGS. 6A(i) and 6A(ii), a substrate 212 is provided (which may be silicon) above which is a buried oxide layer 208. The buried oxide layer may be 400 nm in thickness. Above the buried oxide layer is a silicon-on-insulator 602 which may be 700 nm in thickness.

Figure 6B:
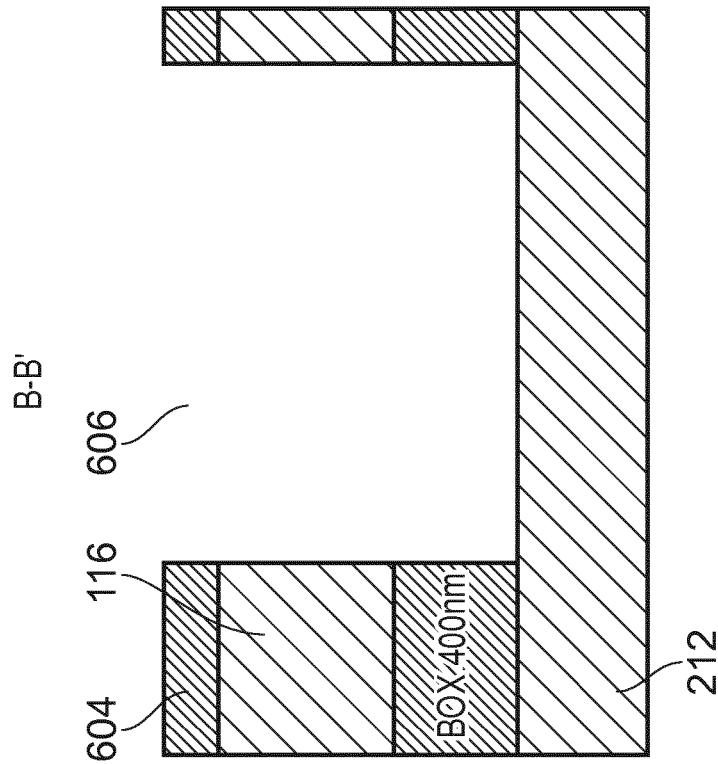
Figure 6B:
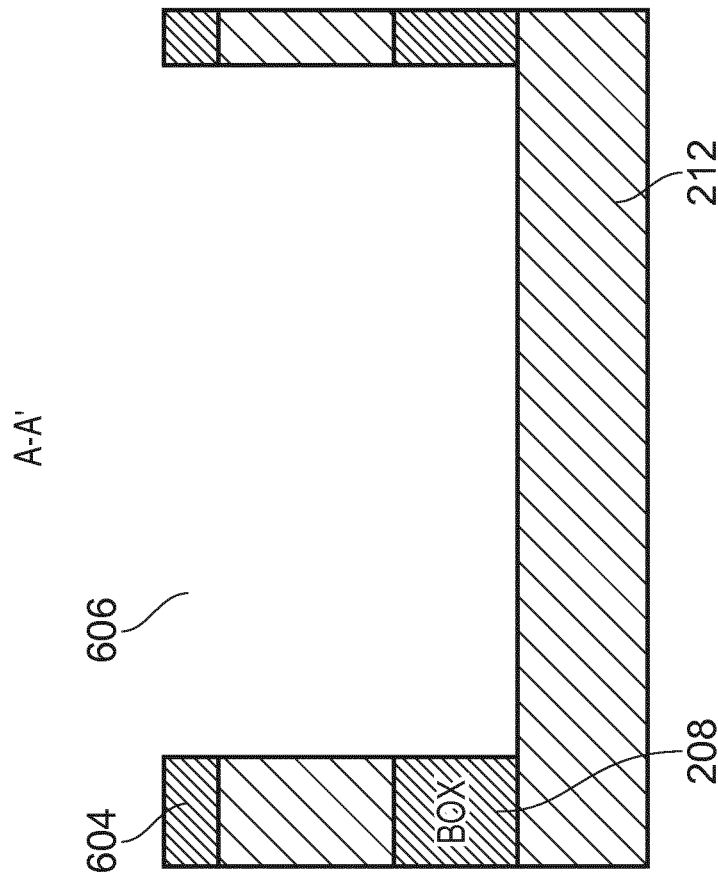

An etching step is then performed as shown in FIGS. 6B(i) and 6B(ii), to produce a cavity 606 which extends beyond the buried oxide layer 208 to the substrate 212. Before the etching step is performed, a hard mask 604 is disposed over the region of the silicon-on-insulating layer 602 which is not to be etched.

After etching, a liner may be disposed within the cavity 606, to thereby line the cavity sidewalls 610 and cavity bed. The liner may be provided as a 20 nm thick SiO$_2$ layer.

Figure 6C:
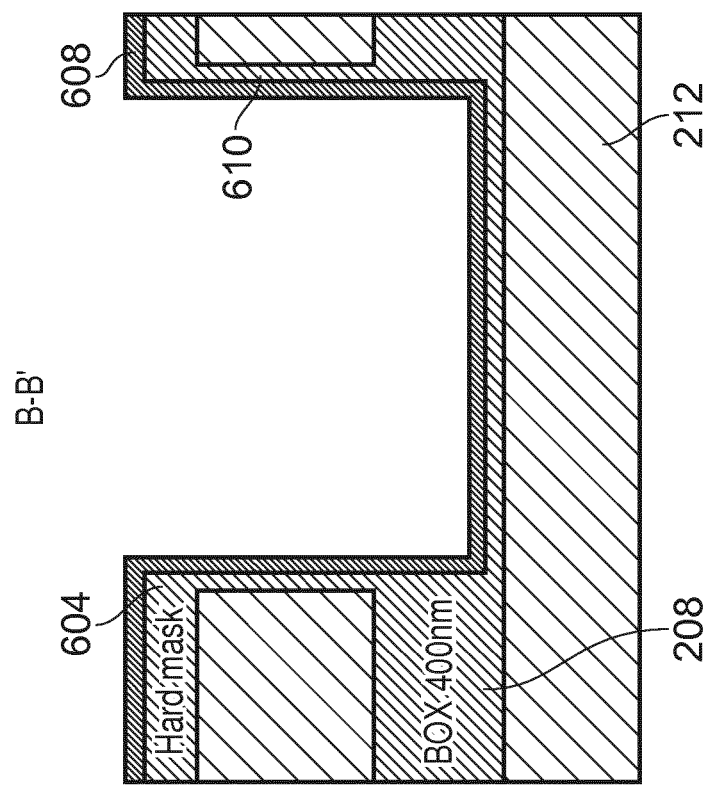
Figure 6C:
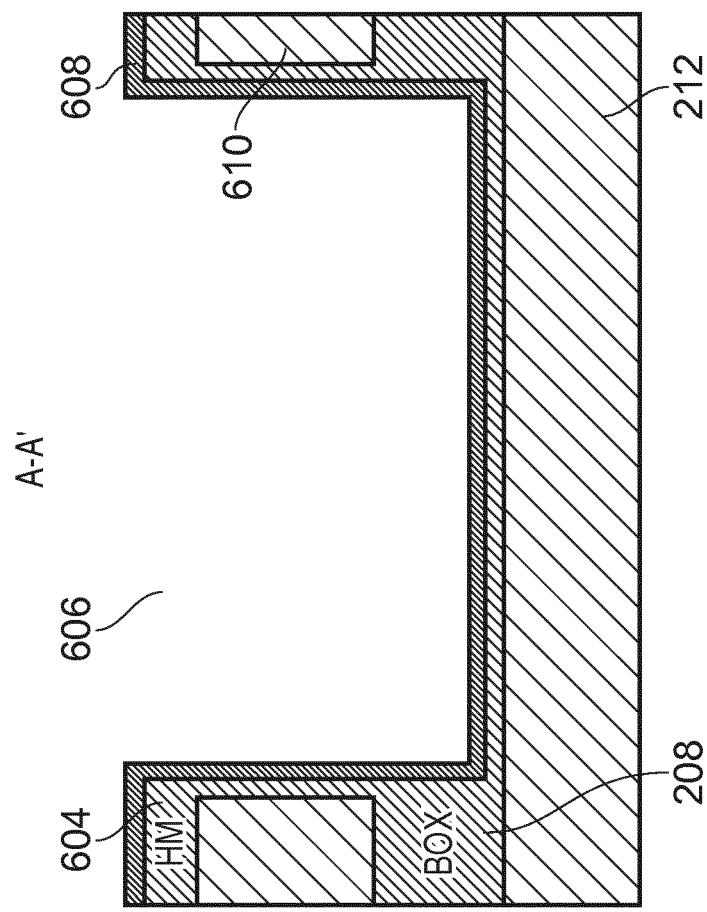
Figure 6D:
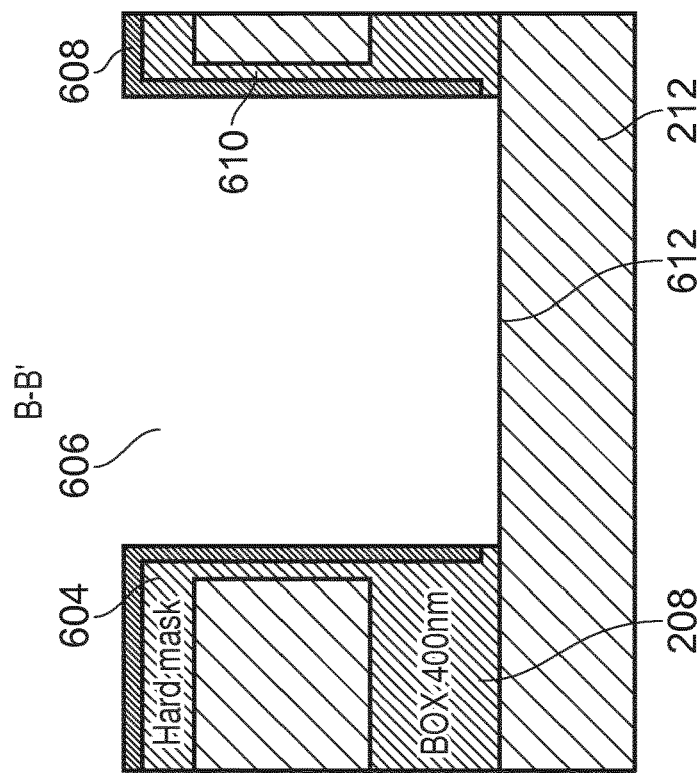
Figure 6D:
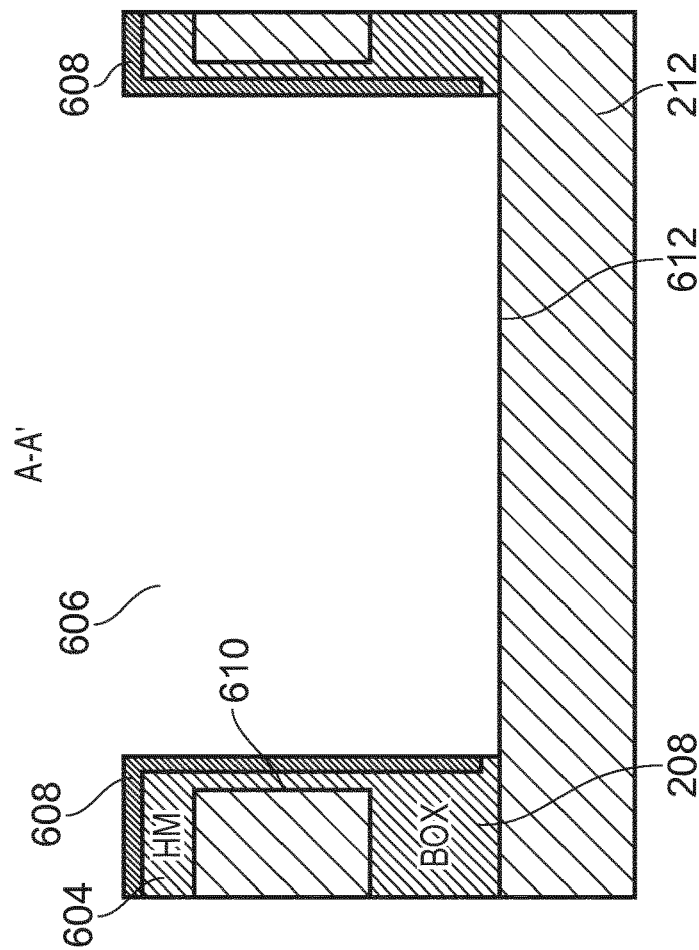

Subsequent to the liner being disposed, a further cover layer 608 is disposed on top of the liner as shown in FIGS. 6C(i) and 6C(ii). The cover layer may be a 20 nm thick Si$_3$N$_4$ layer. This allows the liner and cover layer disposed immediately atop the cavity bed 612 to be etched, leaving a liner 610 and cover layer 608 along the sidewalls of the cavity 606 as shown in FIGS. 6D(i) and 6D(ii). After the cavity bed 612 is exposed, the cover layer 608 can be removed resulting in a device as shown in FIGS. 6E(i) and 6E(ii), where the cavity 606 has an exposed bed 612, but lined sidewalls 610.

Figure 6F:
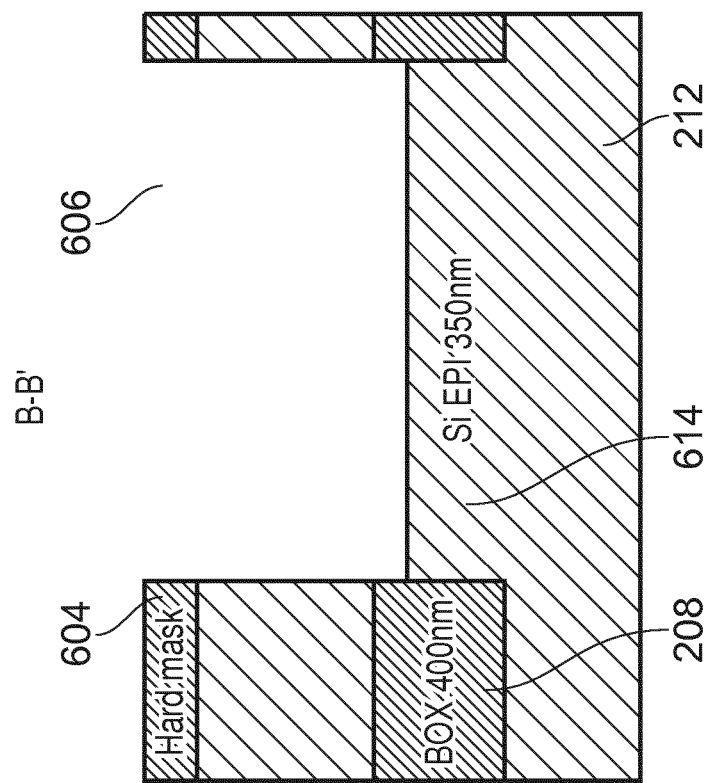
Figure 6F:
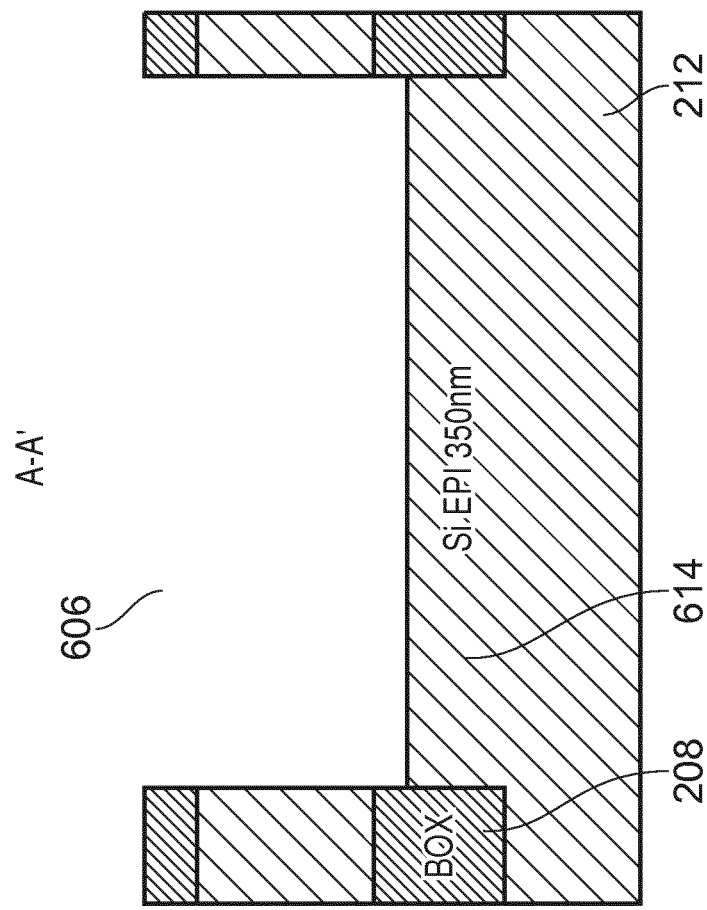

A silicon layer 614 is then epitaxially grown from the bed of the cavity 606 from the substrate 212, as shown in FIGS. 6F(i) and 6F(ii). In this example, the silicon layer is 350 nm tall, and does not extend as high as the uppermost surface of the buried oxide layer 208.

Figure 6G:
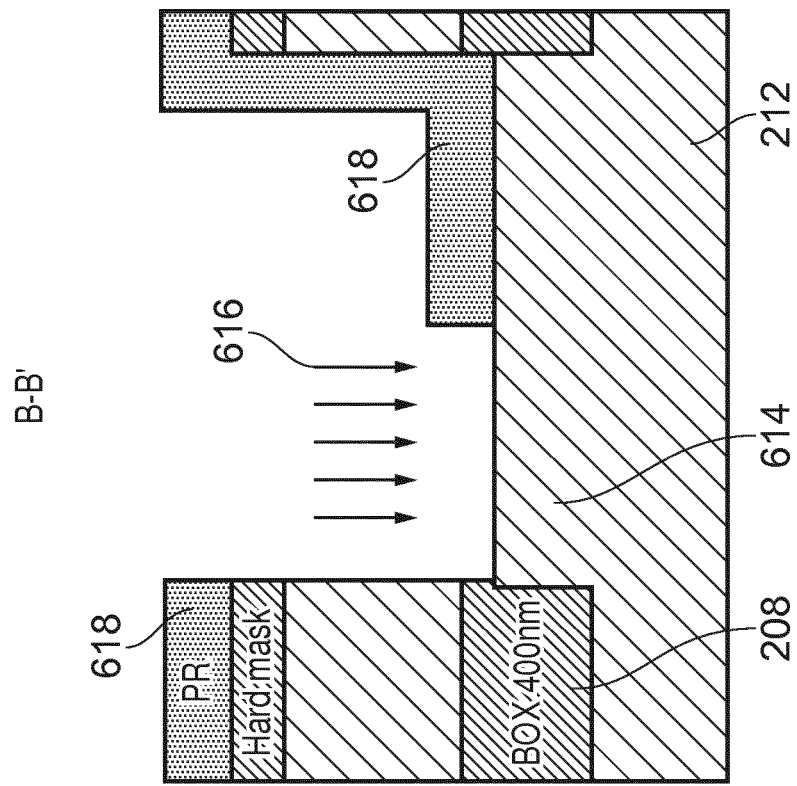
Figure 6G:
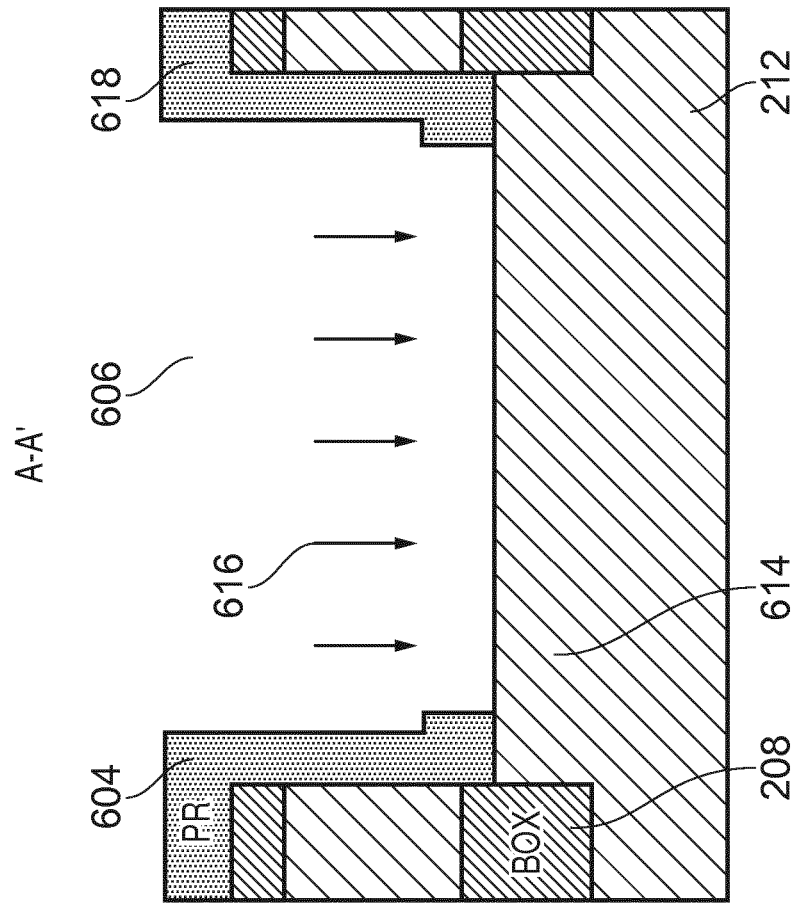
Figure 6H:
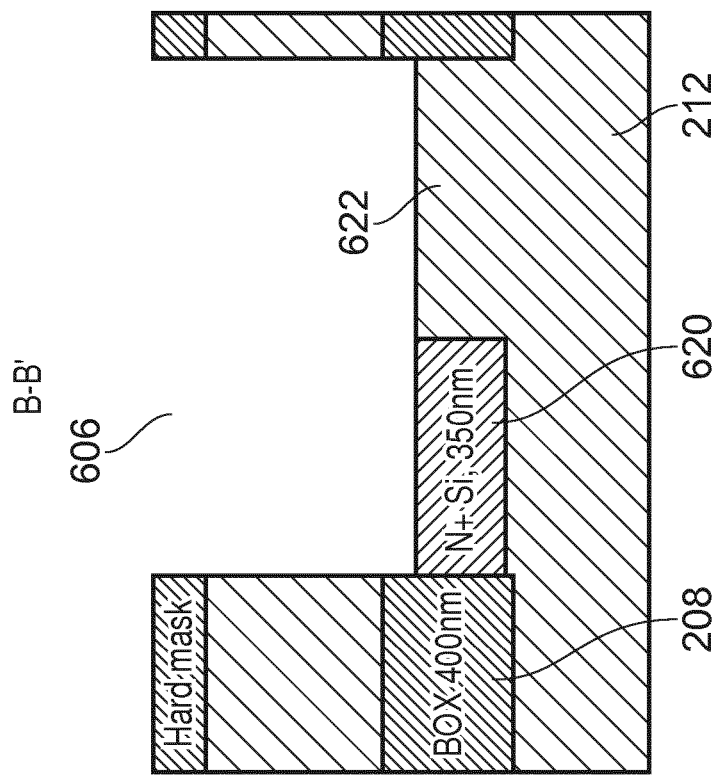
Figure 6H:
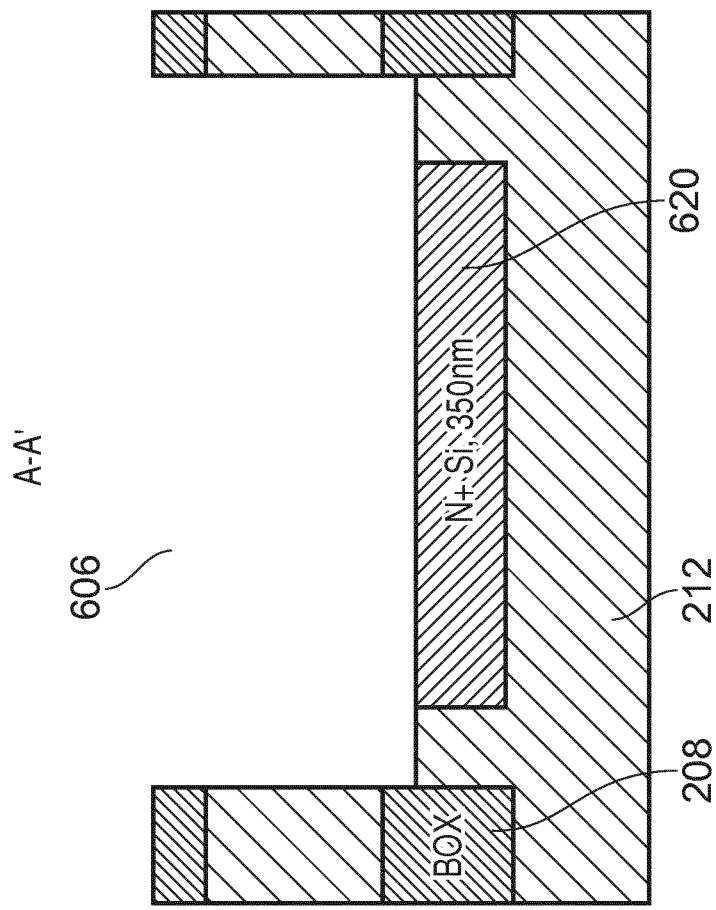

As shown in FIGS. 6G(i) and 6G(ii), a photoresist 618 is then disposed over (i) the top layer of the hard mask 604; (ii) the sidewalls of cavity 606; and (iii) a portion 618 of the bed of the cavity 606. After the photoresist is disposed, dopants 616 of a first species are implanted into an uncovered region 614 of the bed of the cavity 606. The implantation is preferably at around 90° relative to the substrate. The result of this doping is shown in FIGS. 6H(i) and 6H(ii) after the first photoresist has been removed. A doped region 620, extends across a part of the bed of the cavity 606. As shown in FIG. 6H(i), there are undoped regions either side of the doped region between it and the buried oxide layer 208. Similarly, as shown in FIG. 6H(ii) there is an undoped region 622 behind the doped region 620 relative to the guiding direction of the light i.e. on an opposite side of the doped region 620 to the silicon waveguide 112. In this example, the dopants were of an N-type species (e.g. phosphorus), and doping was performed to result in a high dopant concentration. An annealing process is performed at this stage to activate the dopant in the epitaxially grown Silicon layer 622. Typical annealing conditions is 1050-1100° C. for 5-10 seconds with rapid thermal annealing (RTA), and 1050-1100° C. for 10-30 min with furnace annealing. The doped region 620 is an N+ doped region, with a thickness of around 350 nm.

Figure 6I:
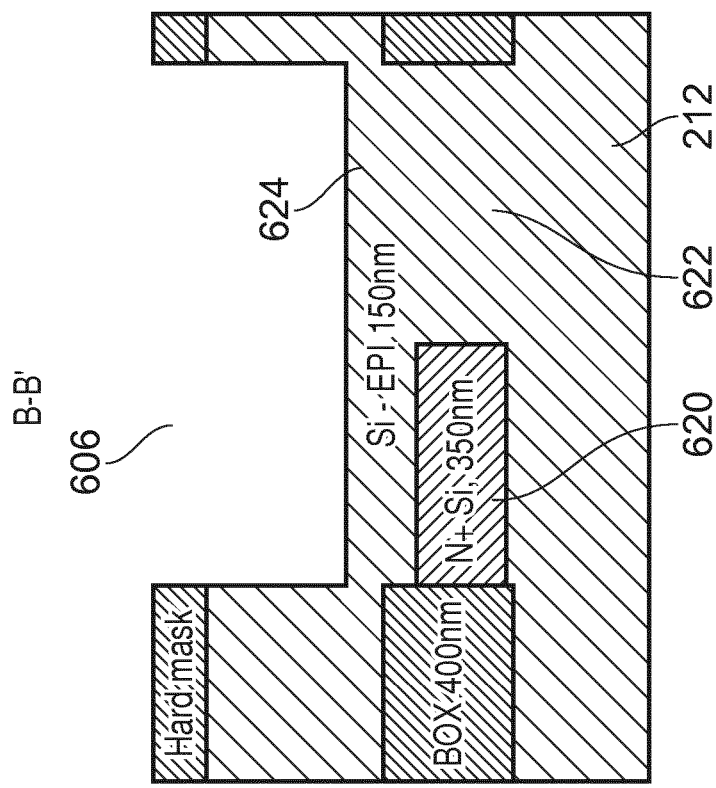
Figure 6I:
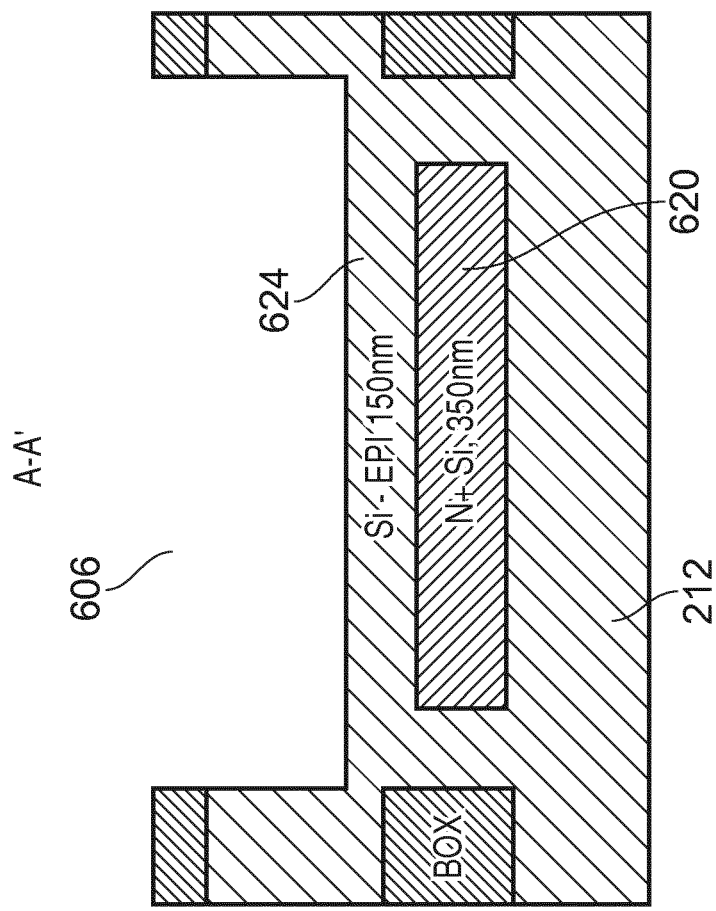
Figure 6J:
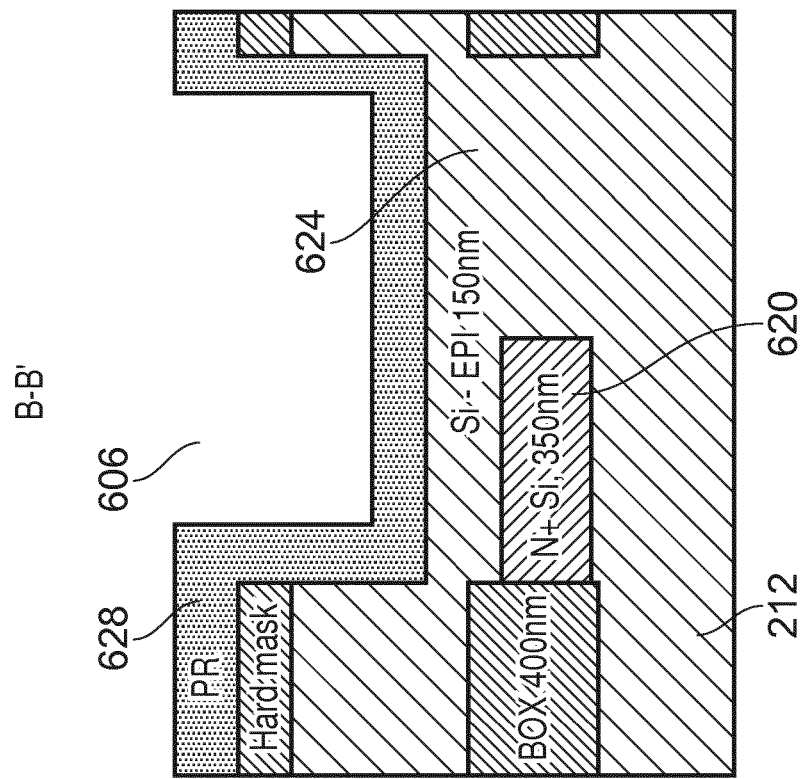
Figure 6J:
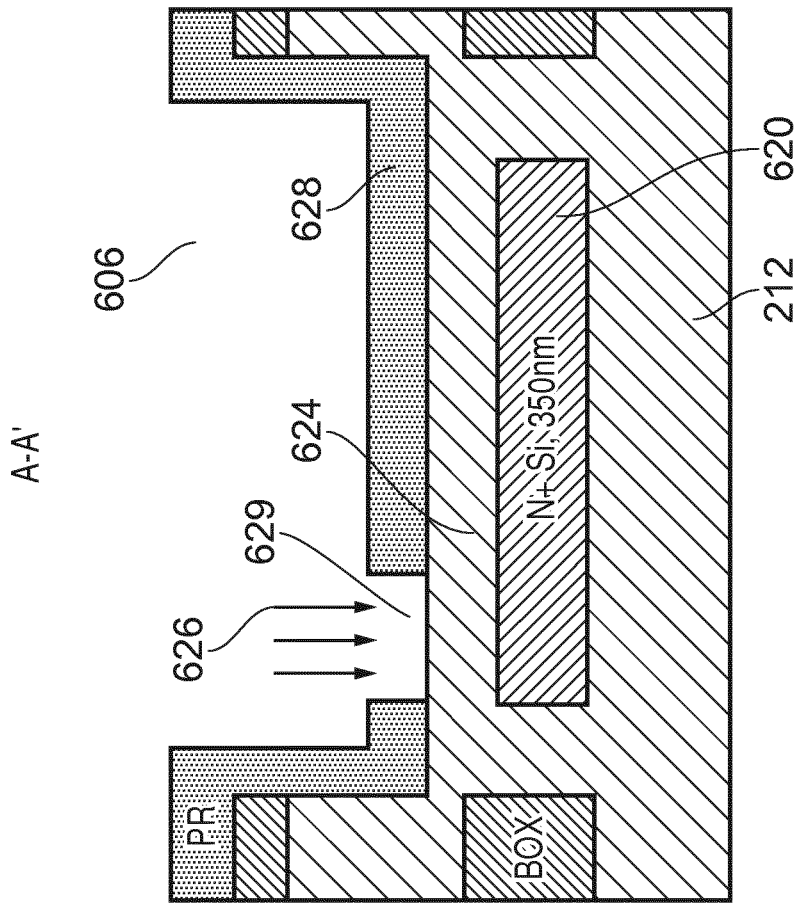

In a subsequent step, shown in FIGS. 6I(i) and 6I(ii), a further epitaxially grown silicon layer 624 is grown from the N+ doped region 620 within cavity 606. The further silicon layer in this example has a thickness of around 150 nm. After the growth, a second photoresist 628 is disposed over a part of the further silicon layer 624, but leaving an implantation window 629 over a region of the further silicon layer, as shown in FIGS. 6J(i) and 6J(ii). After the second photoresist has been disposed, further dopants 626 of the same species used in the step shown in FIGS. 6G(i) and 6G(ii) are implanted into the uncovered region of the further silicon layer 624. Preferably the implantation is an un-angled implantation, i.e. it is performed at around 90° relative to the substrate.

Figure 6K:
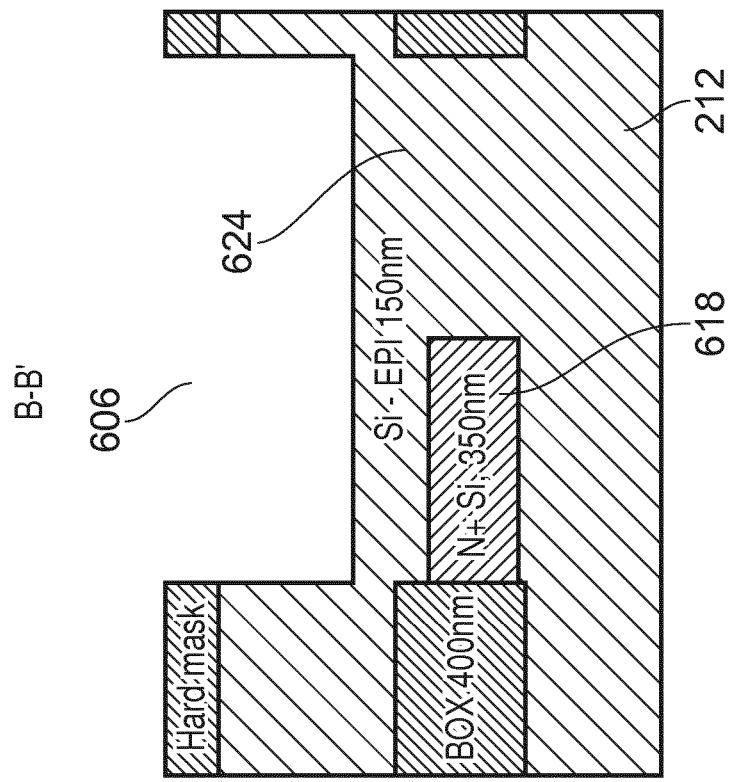
Figure 6K:
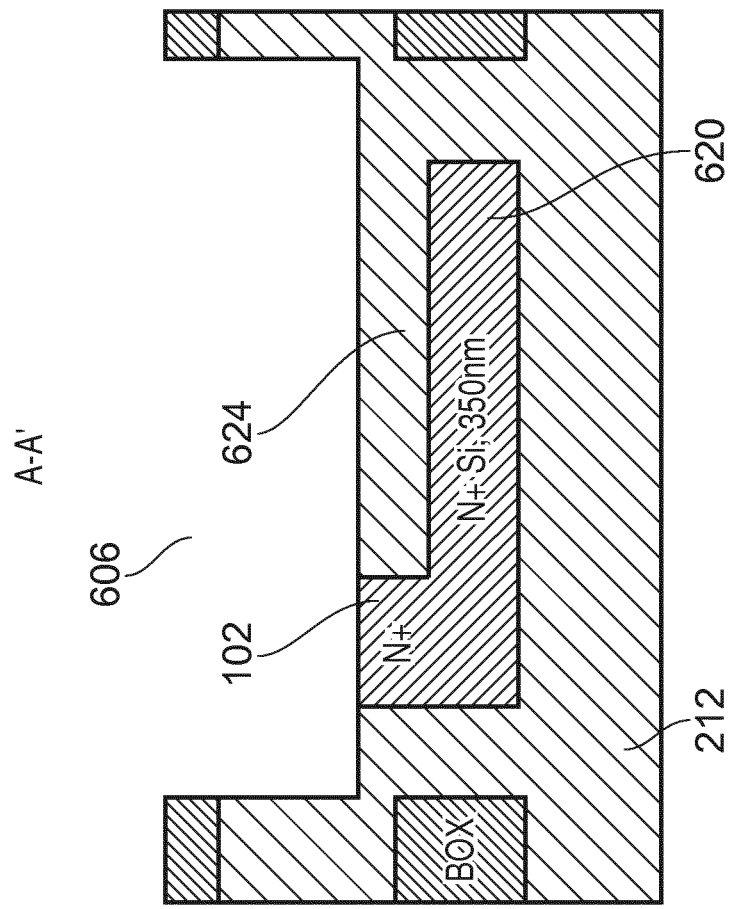

The result of this further doping is shown in FIGS. 6K(i) and 6K(ii), where a part 102 of the N+ doped region extends away from the substrate 212 through a part of the further Silicon layer 624. The N+ doped region therefore has an 'L' shape.

Figure 6L:
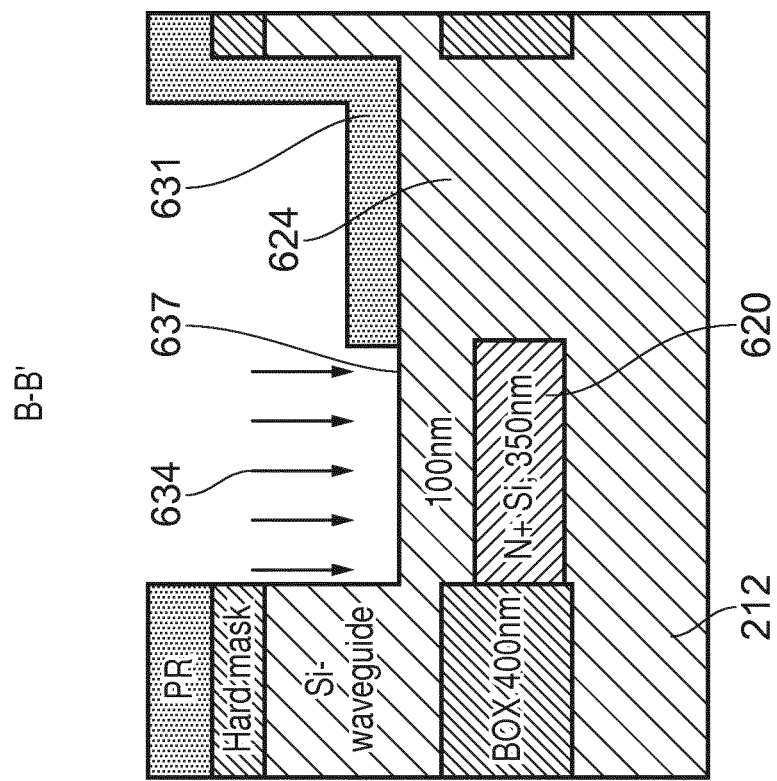
Figure 6L:
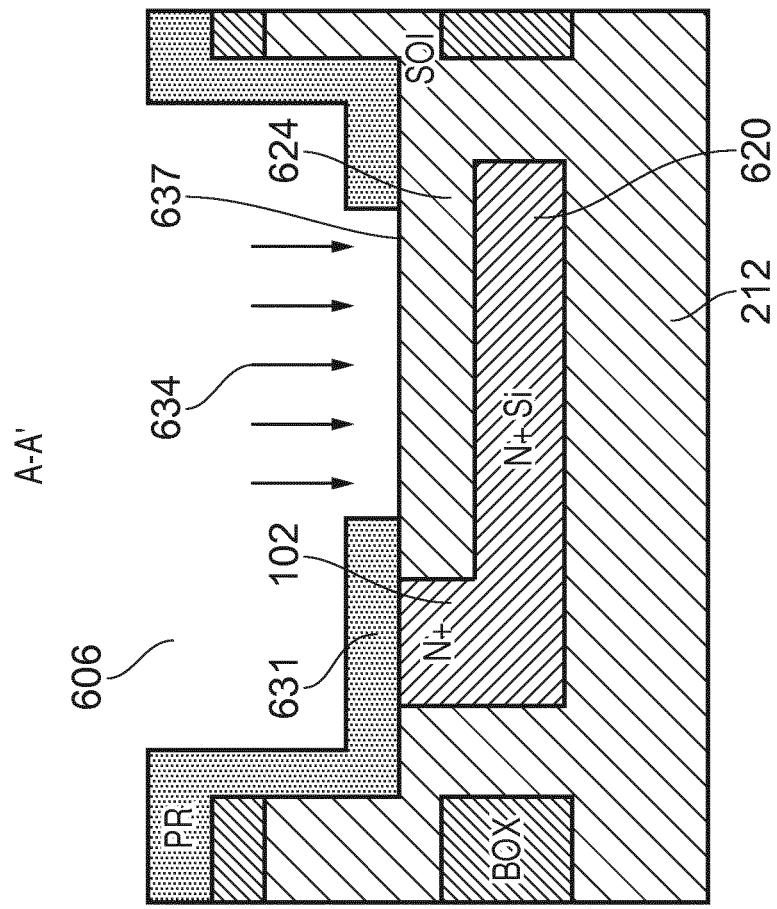

Next, a third photoresist 631 is disposed over the device, leaving an implantation window 637 above a region of the further silicon layer 624, as shown in FIGS. 6L(i) and 6L(ii). Dopants 634 of a second species are then implanted into the region of the further silicon layer which is exposed by implantation window 637. The dopants in this example are Boron ions, and so P doping occurs to the exposed region of the further silicon layer. Preferably the implantation is an un-angled implantation, i.e. it is performed at around 90° relative to the substrate.

Figure 6M:
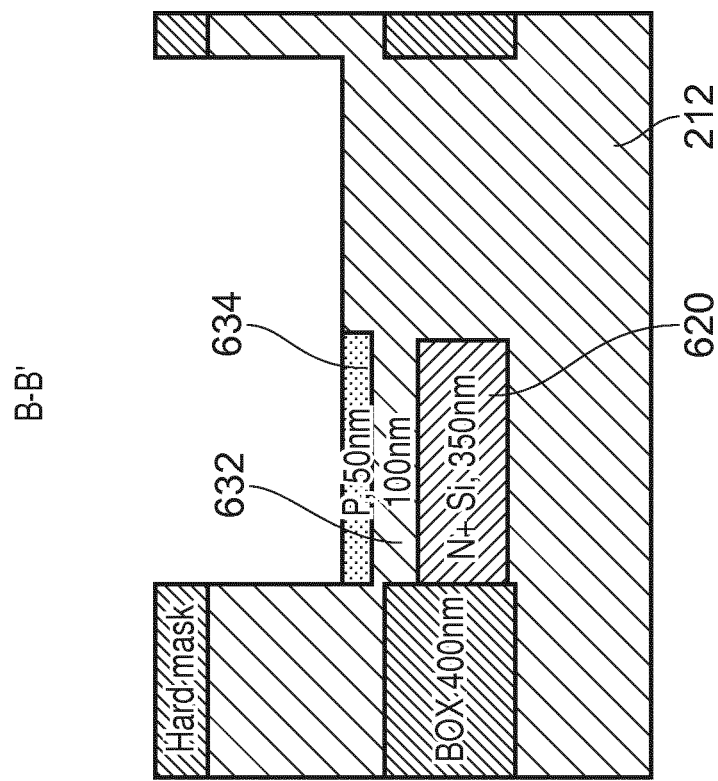
Figure 6M:
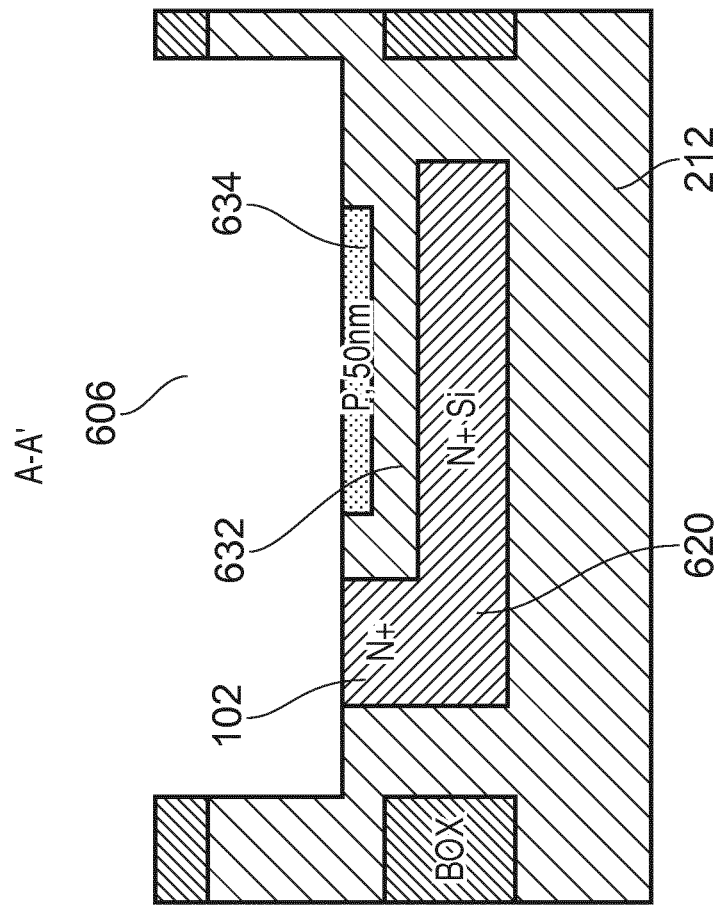

After doping is completed, the device may be annealed at 1050-1100° C. for 5-10 seconds to activate the dopants as shown in FIGS. 6M(i) and 6M(ii). The P doped region 634 in this example is around 50 nm in thickness, and the region between the P doped region and the N+ doped region 620 is the multiplication region 632. The multiplication region is around 100 nm high (i.e. it spans a distance of 100 nm between the bottom of the P doped region 634 and the top of the N+ doped region 620). As discussed above, the multiplication region is not intentionally doped (and therefore it will generally have a dopant concentration of less than $1 \times 10^{16}$ cm$^{-3}$).

Figure 6N:
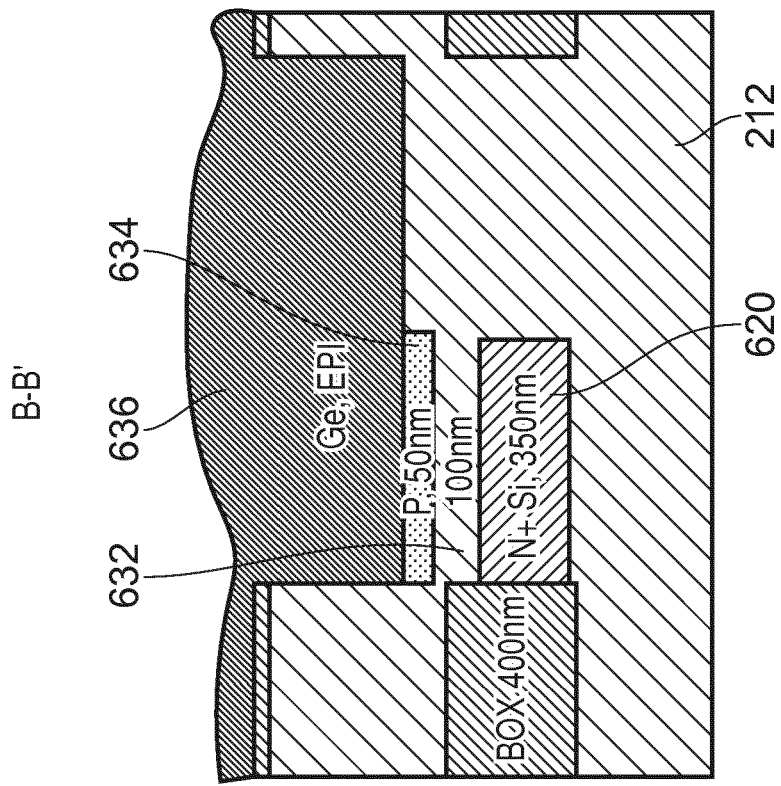
Figure 6N:
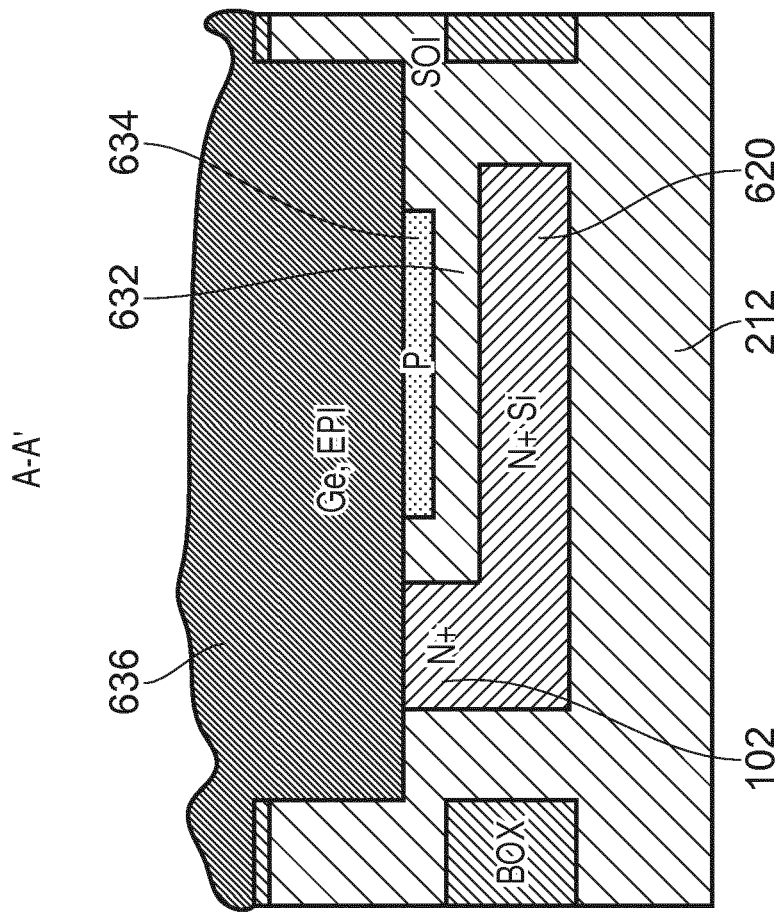
Figure 6O:
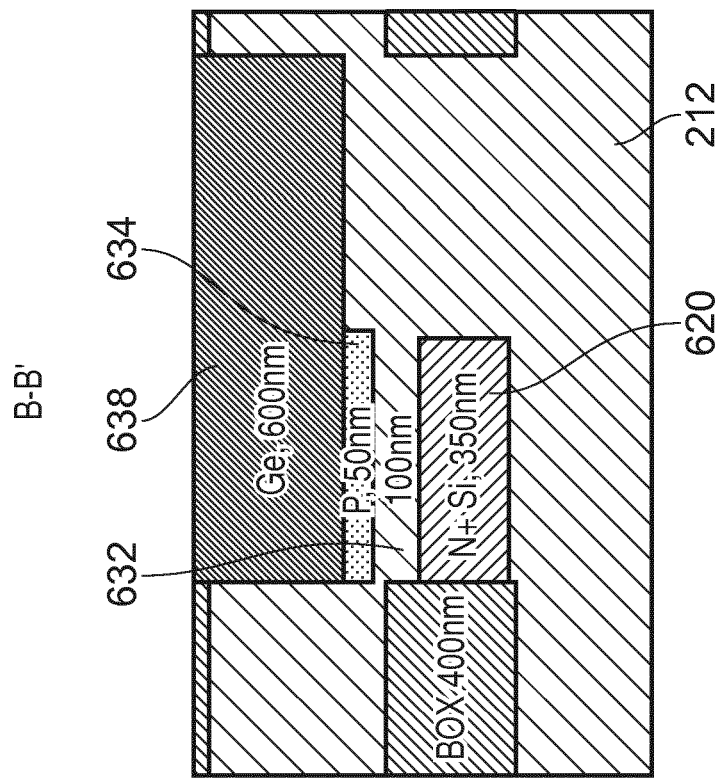
Figure 6O:
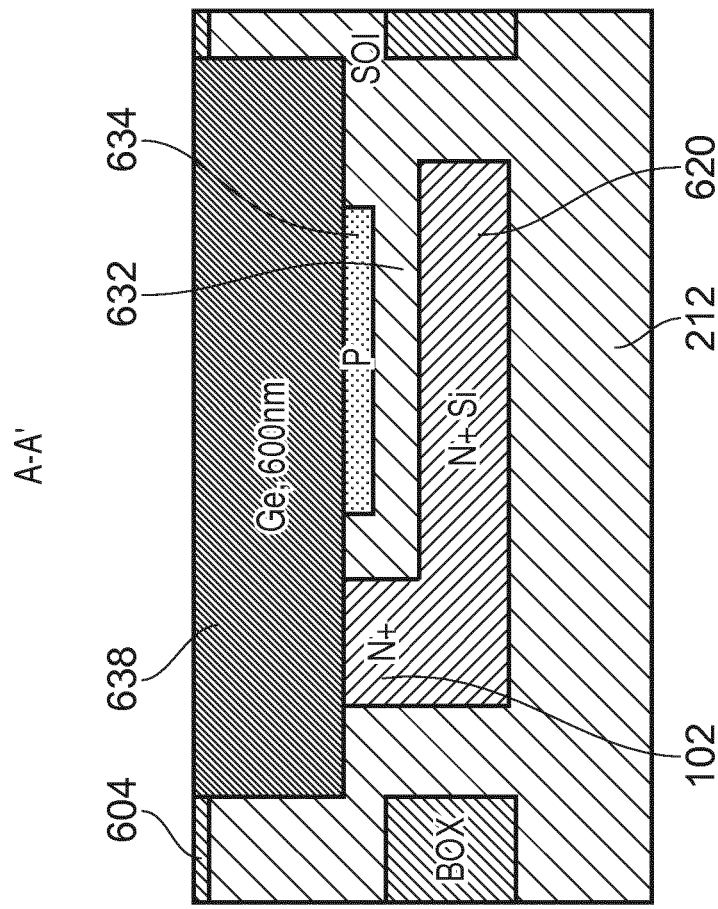

In a further step, germanium 636 is epitaxially grown into the cavity 606 as shown in FIGS. 6N(i) and 6N(ii). Initially the growth of germanium results in a rough and uneven uppermost surface as indicated in the figures, and may extend out of the cavity. The germanium substantially fills the cavity 606. The rough and uneven surface is then smoothed by, for example, chemical-machine planarization (CMP). The result of this planarization is shown in FIGS. 6O(i) and 6O(ii). The uppermost surface of the germanium is substantially level with the hard mask 604.

Figure 6P:
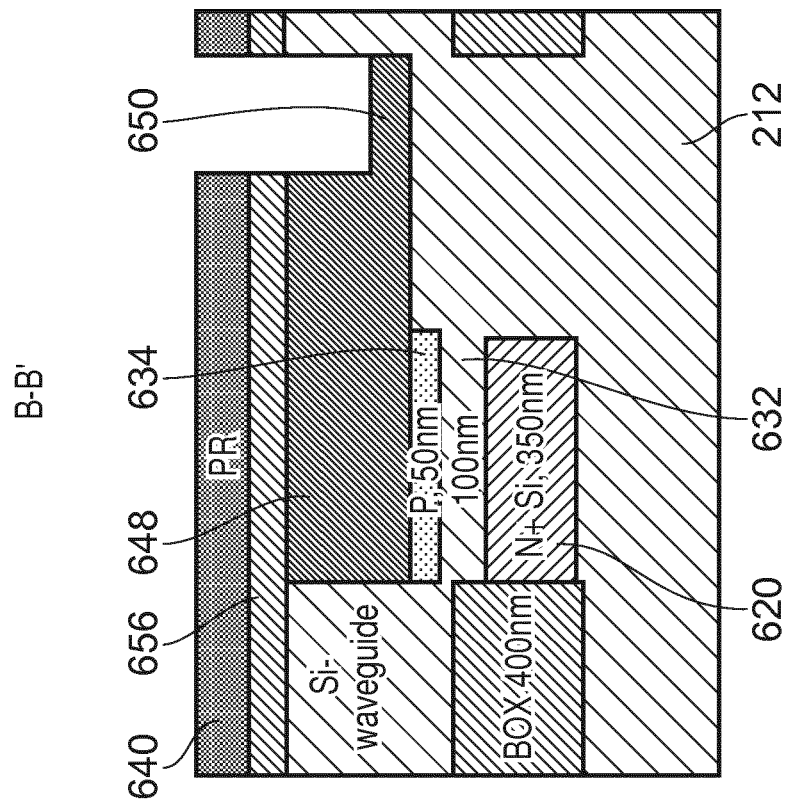
Figure 6P:
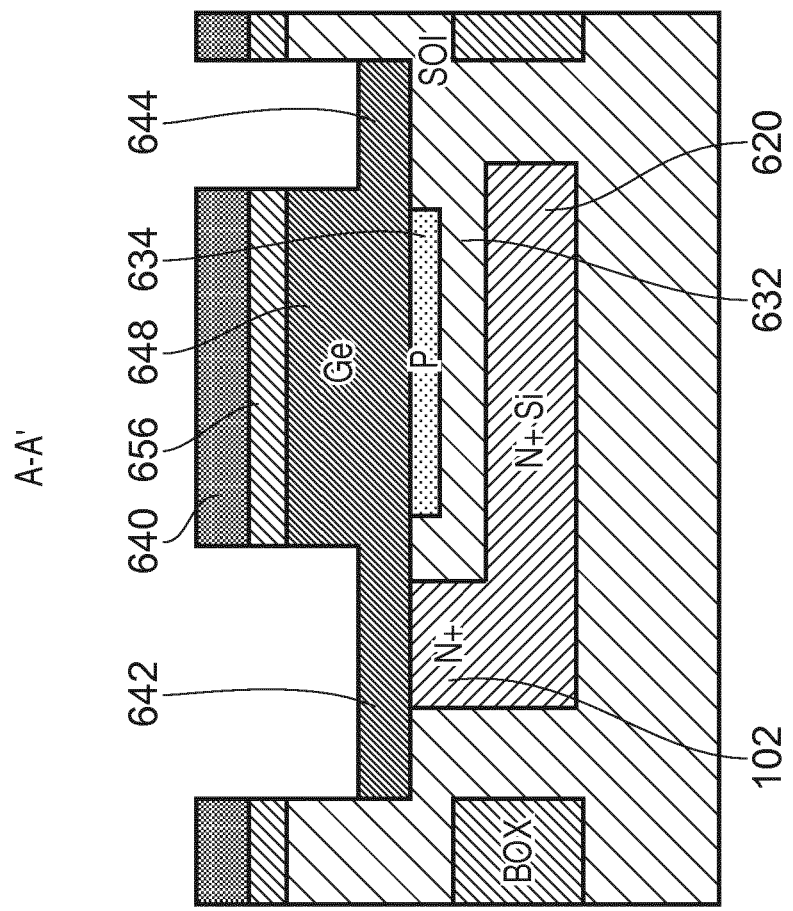

A mask layer 656 is then disposed over the germanium, as well as the regions of the silicon-on-insulator layer which are not within the cavity 606. A photoresist 640 is then disposed over the mask layer to pattern the waveguides in both the germanium and the SOI, therefore, the germanium waveguide and the silicon waveguide are self-aligned and may be formed by a single step of etching process. The result after the etching is shown in FIGS. 6P(i) and 6P(ii). The germanium now provides a rib waveguide, comprising a rib 648, first and second lateral slabs 642 and 644, as well as a rear-most slab 650 towards the back of the device (i.e. on an opposite side of the device to the Silicon waveguide).

Further etching then takes place after a photolithographic process to define the waveguide which is covered by photoresist PR, to make the rib 648 and the lateral extension of slabs 642, 644 and 650. The etching also exposes N+ doped region 102 for connection to the electrode. The result of this further etching is shown in FIGS. 6Q(i) and 6Q(ii). In some examples, after the further etching stage the germanium waveguide has a width of around 1.5 μm. The further etching should be sufficient so as to expose the N+ doped region 102.

Figure 6R:
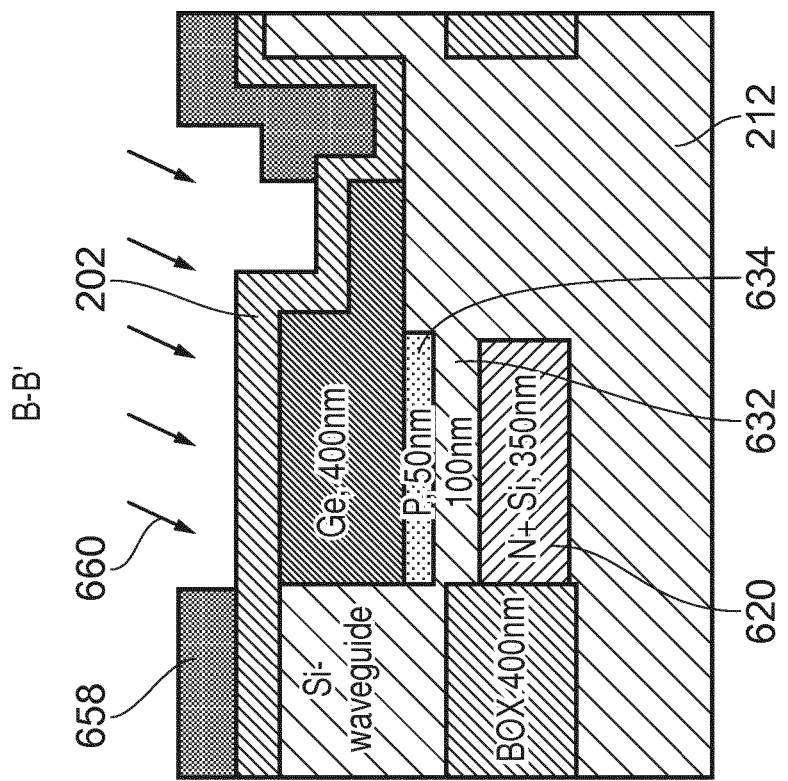
Figure 6R:
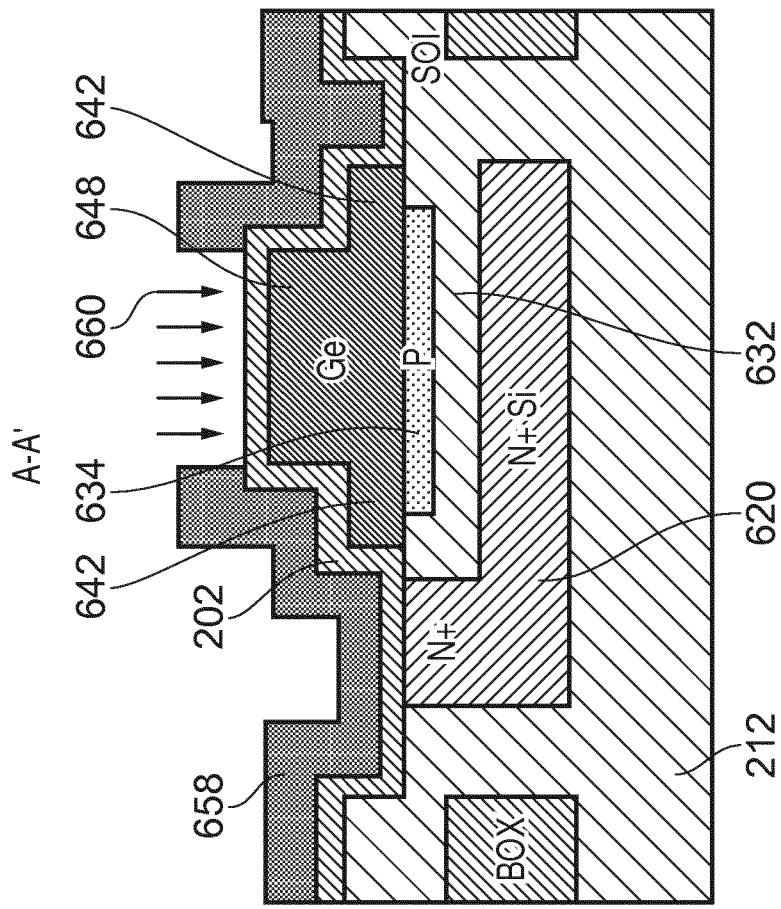

Next, a thin layer of SiO$_2$ 202 is disposed over the device, having a thickness of between 20-50 nm, and a photoresist 658 then disposed over a portion of the device to define the P+ region as shown in FIGS. 6R(i) and 6R(ii), over the rib 648 of the germanium waveguide. Dopants 660 of a second species are then implanted into the rib 648 of the germanium waveguide and the rear-most slab 650. As shown in FIG. 6R(ii), these dopants may be implanted at an angle of 45° relative to the uppermost surface of the rib 658. In this example, the dopants are Boron, and therefore a P-type species dopant.

The photoresist is then removed, and a thick layer of SiO$_2$ (about 500 nm) is deposited followed by an annealing process with a temperature 600-630° C. for 5 to 10 seconds to activate the dopant Boron. Notably, the dopants will also produce a doped region 662 in the rear-most slab 650. This is shown in FIGS. 6S(i) and 6S(ii). The concentration of the P-type dopants is generally greater than $1 \times 10^{19}$ cm$^{-3}$, and therefore the doped regions 108 and 662 are P+ type doped in comparison to region 634. The doped regions 108 and 662 are generally 200 nm in thickness.

After opening via, a final metallization step is performed, illustrated in FIGS. 6T(i) and 6T(ii), first electrode 104 is disposed so as to contact N+ doped region 102, and second electrode 106 is disposed so as to contact P+ doped region 662.

FIGS. 7(i) and 7(ii) show a variant step which would replace the step shown in FIGS. 6G(i) and 6G(ii). Here, as opposed to doping the bed 614 of the cavity 606 with ion implantation process, instead the entire bed of the cavity is doped with in situ N+ species dopants during the EPI process to form N+ doped region 702 with a thickness of 350 nm. Then a silicon layer 624 can be grown from the N+ doped region 702 within cavity 606. After this variant step, the steps shown in FIGS. 6H(i)-6T(ii) are performed as described as above. An advantage to this variant step is to remove one ion implantation process and one annealing process as compared with the previously described method, which can reduce the complexity of manufacture. The variant step shown in FIGS. 7(i) and 7(ii) results in a device as shown in FIGS. 3A and 3B (when the lower doped region is a N+ doped region) or a device as shown in FIGS. 5A and 5B (when the dopants are a P-type species dopant).

Figure 8:
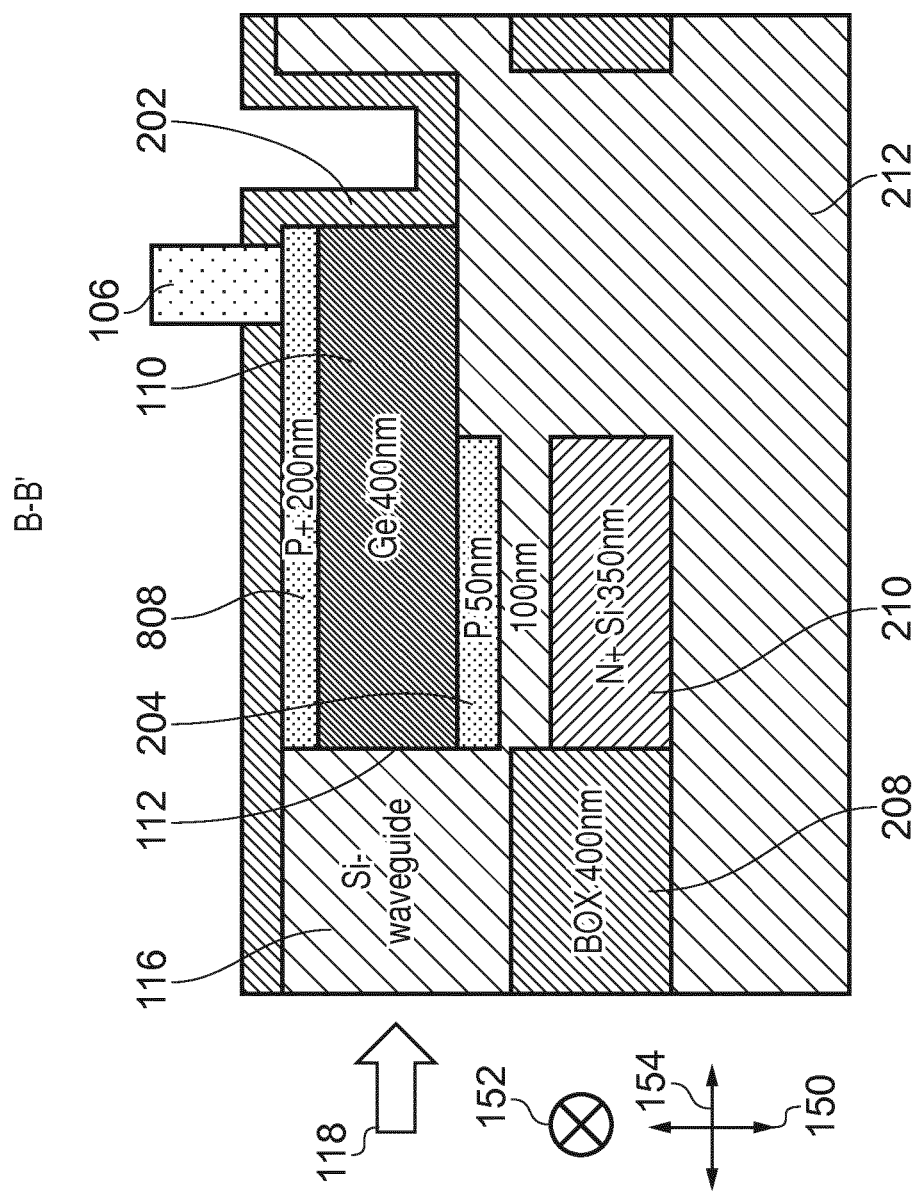
FIG. 8 shows a variant structure for the second electrode.

FIG. 8 shows a variant structure for the second electrode as taken along the cross-section B-B' indicated in FIG. 1. Unlike that in FIG. 2B, the P+ region 808 of FIG. 8 is not etched down to the slab thickness of 300 nm i.e. the P+ doped region has a generally constant height relative to the substrate.

Figure 9A:
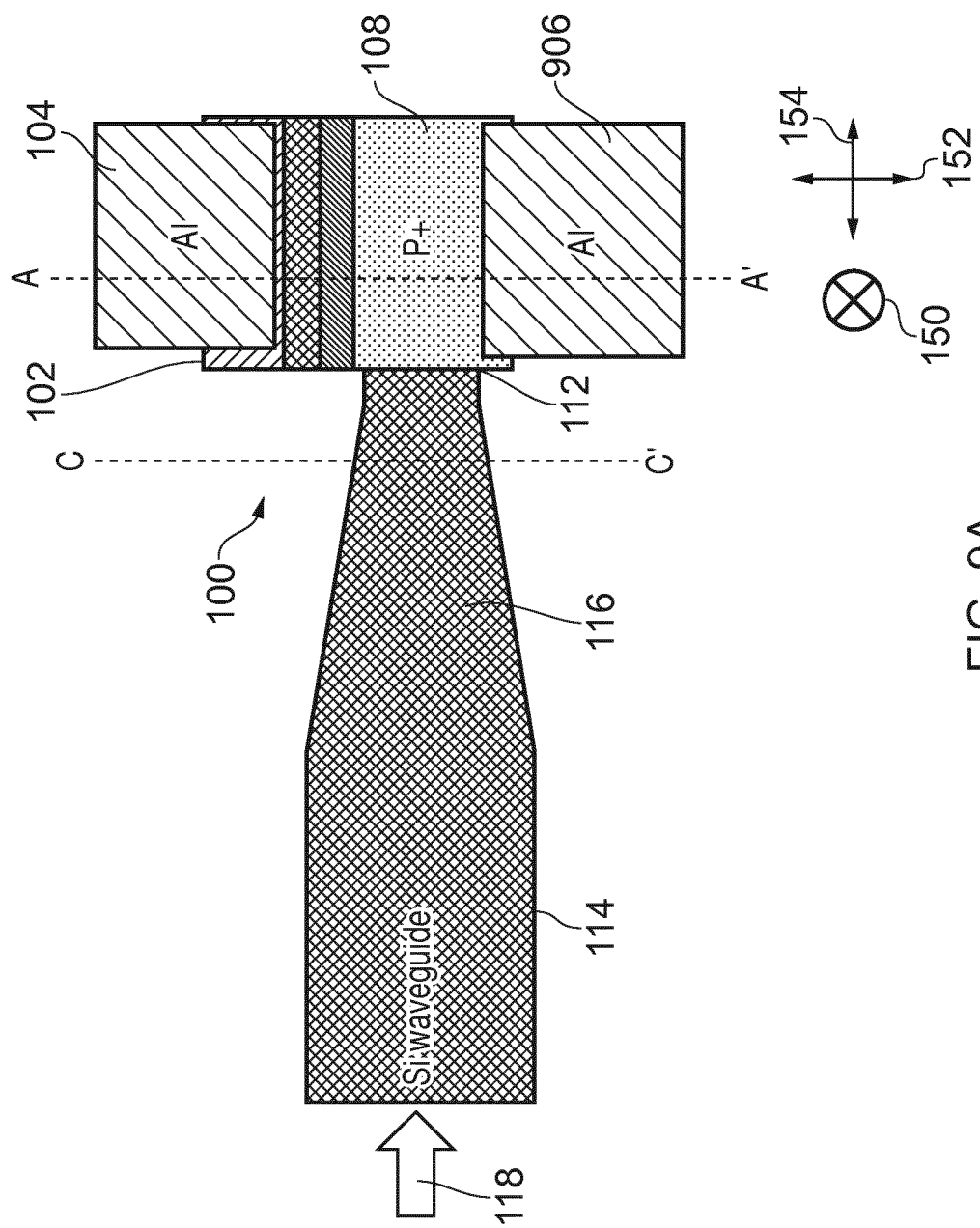
FIGS. 9A and 9B show the structure top view and cross-section of a variant device.
Figure 9B:
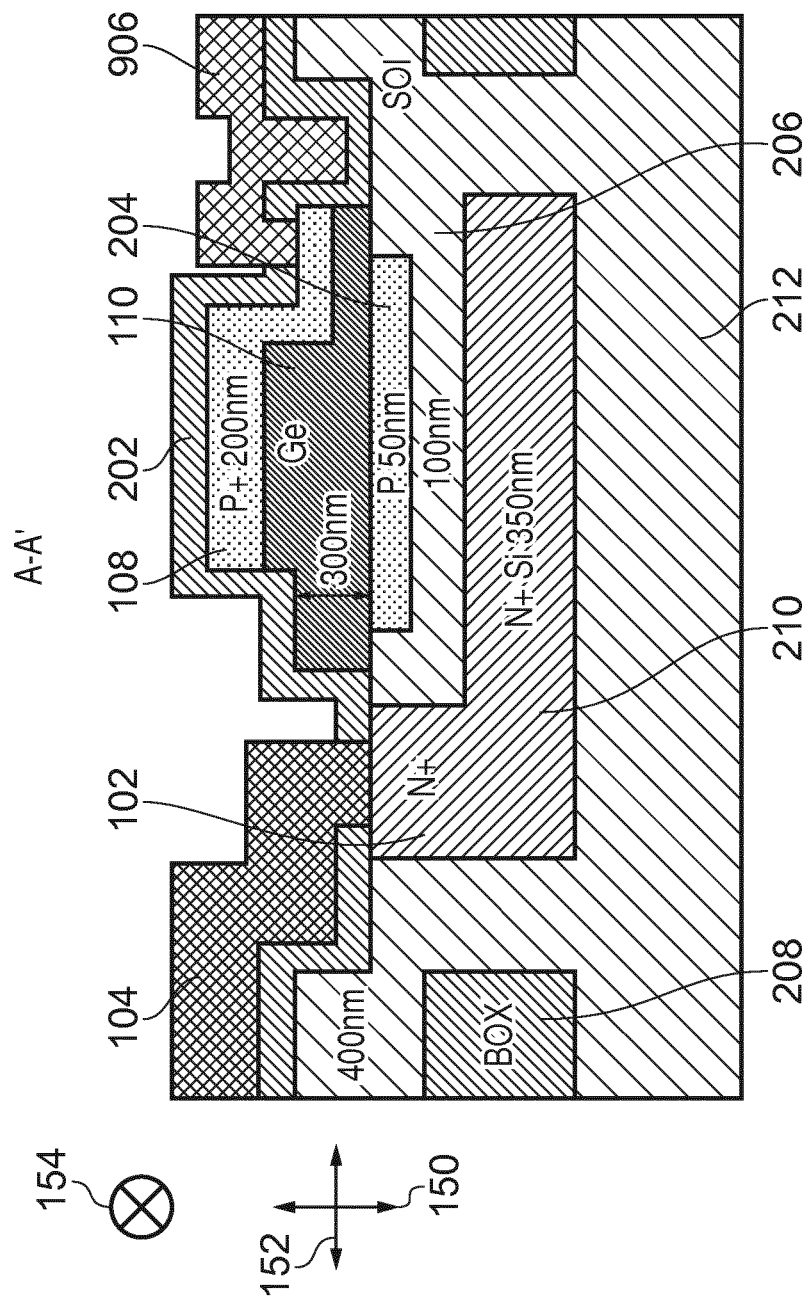

FIGS. 9A and 9B show a variant device top view and cross-section view along A-A'. In FIG. 9A, the second slab in the opposite direction of the first electrode 104 is P+ doped, and the second electrode 906 contacts the second slab. FIG. 9B shows the same device as taken along the cross-section A-A' indicated in FIG. 9A. The second slab is P+ doped and the second electrode 906 is contacted with the second slab and extends laterally in the opposite direction of the first electrode 104.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

LIST OF FEATURES

100 Avalanche photodiode
102 N+ doped region extending to reach electrode
104 First electrode
106 Second electrode
906 Second electrode
108 Upper P+ doped region
808 Upper P+ doped region
110 Germanium rib waveguide
112 Germanium rib waveguide/silicon taper waveguide interface
114 Input waveguide
116 Tapered region of the input waveguide
118 Input light
120 P+ doped region extending to contact electrode
150 Vertical direction (into the plane of the device)
152 First transversal direction
154 Second transversal direction
202 Cladding layer
204 Intermediate P doped region
206 Multiplication region
208 Buried oxide layer
210 Lower N+ doped region
212 Substrate
220 Silicon slab
302 Lower N+ doped region
404 Intermediate N doped region
408 Upper N+ doped region
410 Lower P+ doped region
414 P+ doped region extending to reach electrode
510 Lower P+ doped region
514 P+ doped region extending to reach electrode
602 Silicon-on-insulator layer
606 Cavity
604 Hard mask
608 Cover layer
610 Lined cavity sidewall
612 Cavity bed
614 Epitaxially grown silicon layer
616 Dopants
618 Photoresist
620 Lower N+ doped region
622 Undoped epitaxially grown silicon region
624 Further epitaxially grown silicon layer
626 Dopants
628 Second photoresist
629 Implantation window in photoresist
631 Third photoresist
632 Undoped multiplication region
634 Intermediate P doped region
636 Epitaxially grown germanium layer
637 Implantation window in third photoresist
638 Planarized germanium layer
640 Fourth photoresist
642 First germanium waveguide slab
644 Second germanium waveguide slab
648 Germanium waveguide rib
650 Third germanium waveguide slab
652 Fifth photoresist
654 Exposed N+ doped region
656 Mask layer
658 Sixth photoresist
660 Dopants
702 N+ doped region extending across the width of the cavity

The invention claimed is:

1. A germanium based avalanche photodiode device, the germanium based avalanche photodiode device including:
a silicon substrate;
a lower doped silicon region, positioned above the silicon substrate;
a silicon multiplication region, positioned above the lower doped silicon region;
an intermediate doped silicon region, positioned above the silicon multiplication region;
an un-doped germanium absorption region, positioned above the intermediate doped silicon region;
an upper doped germanium region, positioned above the un-doped germanium absorption region; and
an input silicon waveguide,
wherein:
the un-doped germanium absorption region and the upper doped germanium region form a germanium waveguide which is coupled to the input silicon waveguide,
the germanium based avalanche photodiode device also includes a first electrode and a second electrode, and the first electrode extends laterally to contact the lower doped silicon region and the second electrode extends laterally to contact the upper doped germanium region, and
one or more of the silicon multiplication region, the germanium waveguide, and the intermediate doped silicon region are at least partially within a cavity of a silicon-on-insulator layer of a silicon-on-insulator (SOI) wafer.

2. The germanium based avalanche photodiode device of claim 1, wherein the lower doped silicon region includes a part which extends away from the silicon substrate so as to contact the first electrode.

3. The germanium based avalanche photodiode device of claim 1, wherein the upper doped germanium region includes a part which extends towards the silicon substrate so as to contact the second electrode.

4. The germanium based avalanche photodiode device of claim 1, wherein the input silicon waveguide and germanium waveguide are rib waveguides.

5. The germanium based avalanche photodiode device of claim 1, wherein the germanium waveguide has a first lateral edge, and the lower doped silicon region is coterminous in lateral extension with the first lateral edge of the germanium waveguide.

6. The germanium based avalanche photodiode device of claim 1, wherein the germanium waveguide has a first lateral edge, and the lower doped silicon region extends laterally beyond the first lateral edge of the germanium waveguide.

7. The germanium based avalanche photodiode device of claim 1, wherein the multiplication silicon region, the germanium waveguide, and the intermediate doped silicon region are within the cavity of the silicon-on-insulator layer.

8. The germanium based avalanche photodiode device of claim 1, wherein the multiplication silicon region is between 50 nm and 150 nm thick.

9. The germanium based avalanche photodiode device of claim 1, wherein the upper doped germanium region and the lower doped silicon region are heavily doped as compared to the intermediate doped silicon region.

10. The germanium based avalanche photodiode device of claim 1, wherein the intermediate doped silicon region is doped with dopants of a same species as the upper doped germanium region.

11. A method of fabricating the germanium based avalanche photodiode device of claim 1, comprising:
providing the silicon substrate and an insulator layer, above which is a silicon-on-insulator layer;
etching the silicon-on-insulator layer and the insulator layer, to form a cavity of the silicon-on-insulator layer which extends to the silicon substrate;
epitaxially growing a first silicon layer from a bed of the cavity;
doping the first silicon layer to form the lower doped silicon region;
growing a second silicon layer from an upper surface of the lower doped silicon region;
doping a first part of the second silicon layer to form the intermediate doped silicon region;
epitaxially growing a germanium layer from an upper surface of the second silicon layer to form the germanium waveguide;
doping a part of the germanium layer to form the upper doped germanium region; and
providing the first electrode and the second electrode, the first electrode contacting the lower doped silicon region and the second electrode contacting the upper doped germanium region.

12. The method of claim 11, further including a step of:
after etching the silicon-on-insulator layer and the insulator layer and before epitaxially growing the first silicon layer: disposing an insulating layer along sidewalls and the bed of the cavity.

13. The method of claim 12, including the step of:
etching the insulating layer which is along the bed of the cavity, thereby leaving an insulating layer along the sidewalls of the cavity.

14. The method of claim 11, including the step of doping a region of the first silicon layer.

15. The method of claim 11, including the step of in-situ doping the first silicon layer during the step of epitaxially growing the first silicon layer.

16. The method of claim 11, including the step of:
etching a part of the germanium layer, to thereby provide a rib waveguide having one or more slab regions.

17. The method of claim 11, including the step of:
before the doping of the part of the germanium layer:
disposing a photoresist over a part of an upper most surface of the partially fabricated germanium based avalanche photodiode device;
and after doping the part of the germanium layer:
removing the photoresist.

18. The method of claim 12, further including a step of:
annealing the partially fabricated germanium based avalanche photodiode device.

19. The method of claim 12, further including a step of:
disposing a cladding layer over the partially fabricated germanium based avalanche photodiode device.

20. A germanium based avalanche photodiode device, the germanium based avalanche photodiode device including:
a silicon substrate;
a lower doped silicon region, positioned above the silicon substrate;
a silicon multiplication region, positioned above the lower doped silicon region;
an intermediate doped silicon region, positioned above the silicon multiplication region;
an un-doped germanium absorption region, positioned above the intermediate doped silicon region;
an upper doped germanium region, positioned above the un-doped germanium absorption region; and
an input silicon waveguide,
wherein:
the un-doped germanium absorption region and the upper doped germanium region form a germanium waveguide which is coupled to the input silicon waveguide,
the germanium based avalanche photodiode device also includes a first electrode and a second electrode, and the first electrode extends laterally to contact the lower doped silicon region and the second electrode extends laterally to contact the upper doped germanium region, and
one or more of the lower doped silicon region and the silicon multiplication region are at least partially within a cavity of a buried oxide (BOX) layer of a silicon-on-insulator (SOI) wafer.

* * * * *